(12) United States Patent
Ogawa et al.

(10) Patent No.: US 6,864,621 B2
(45) Date of Patent: Mar. 8, 2005

(54) PIEZOELECTRIC ELEMENT AND METHOD FOR MANUFACTURING THE SAME

(75) Inventors: Hirozumi Ogawa, Shiga-Ken (JP); Masahiko Kimura, Kusatsu (JP); Koichi Hayashi, Kusatsu (JP); Akira Ando, Omihachiman (JP)

(73) Assignee: Murata Manufacturing Co., Ltd. (JP)

( * ) Notice: Subject to any disclaimer, the term of this patent is extended or adjusted under 35 U.S.C. 154(b) by 109 days.

(21) Appl. No.: 10/394,146

(22) Filed: Mar. 24, 2003

(65) Prior Publication Data

US 2003/0178918 A1 Sep. 25, 2003

(30) Foreign Application Priority Data

Mar. 25, 2002 (JP) ........................................ 2002-084525
Jan. 29, 2003 (JP) ........................................ 2003-020657

(51) Int. Cl.[7] ...................... C04B 35/475; H01L 41/187
(52) U.S. Cl. ..................... 310/358; 310/365; 310/357; 310/320; 29/25.35; 252/62.9 R
(58) Field of Search ................................ 310/358, 357, 310/365, 320; 252/62.9 R; 29/25.35

(56) References Cited

U.S. PATENT DOCUMENTS

| | | | | |
|---|---|---|---|---|
| 5,914,068 A | * | 6/1999 | Hiratani et al. | 252/62.9 R |
| 6,299,815 B1 | * | 10/2001 | Kimura et al. | 264/235 |
| 6,692,652 B2 | * | 2/2004 | Takao et al. | 252/62.9 R |
| 6,734,606 B2 | * | 5/2004 | Kimura et al. | 310/358 |
| 6,753,642 B2 | * | 6/2004 | Ogawa et al. | 310/358 |
| 6,767,503 B2 | * | 7/2004 | Ogawa et al. | 264/650 |
| 2002/0005683 A1 | * | 1/2002 | Kimura et al. | 310/358 |
| 2003/0071240 A1 | * | 4/2003 | Kimura et al. | 252/62.9 R |
| 2003/0085636 A1 | * | 5/2003 | Ando et al. | 310/358 |
| 2003/0213426 A1 | * | 11/2003 | Natori et al. | 117/84 |

FOREIGN PATENT DOCUMENTS

JP 2003026473 A * 1/2003 ........... H01L/41/24

OTHER PUBLICATIONS

Grain–Oriented and Mn–Doped $(NaBi)_{(1-x)/2}Ca_xBl_4Ti_4O_{15}$ Ceramics for Piezo– and Pyrosensor Materials; Tadashi Takenaka and Koichiro Sakata—*Sensors and Materials*, 1 (1988) 035–046.

Melt–textured Growth of Polycrystalline; S. Jin, etc.—*Physical Review B*, vol. 37, No. 13.

Dielectric and Electromechanical Properties of Textured Niobium–Doped Bismuth Titanate Ceramics; Seong–Hyeon Hong, etc.—*Journal Am. Ceram. Soc.* 83 [1] 113–118 (2000).

* cited by examiner

*Primary Examiner*—Darren Schuberg
*Assistant Examiner*—J. Aguirrechea
(74) *Attorney, Agent, or Firm*—Dickstein, Shapiro, Morin & Oshinsky, LLP

(57) ABSTRACT

A laminate type piezoelectric element having an improved piezoelectric property is provided. Vibration electrodes are arranged in a piezoelectric body, and high-order vibration of the thickness vibration is excited. The piezoelectric ceramic includes two ceramic piezoelectric layers which are laminated, and are integrally formed. Each of the ceramic piezoelectric layers contains ceramic crystal grains having shape anisotropy and spontaneous polarization preferentially oriented in one plane. The in-plane direction of this plane is perpendicular to the principal surfaces of the ceramic piezoelectric layers. The ceramic piezoelectric layers are polarized in the same thickness direction.

19 Claims, 27 Drawing Sheets 34 34 34 34 34 34

34 34

DIRECTION SUITED FOR POLARIZATION

DIRECTION SUITED FOR POLARIZATION

PEAK OF (119) PLANE IS THE HIGHEST IN RANDOM-ORIENTATION CONDITION.

DIRECTION OF NORMAL TO (020) PLANE BECOMES PERPENDICULAR TO ELEMENT SURFACE DUE TO ORIENTATION. REFLECTION INTENSITY OF (020) PLANE IS INCREASED.

PIEZOELECTRIC ELEMENT AND METHOD FOR MANUFACTURING THE SAME

BACKGROUND OF THE INVENTION

1. Field of the Invention

The present invention relates to a piezoelectric element and a method for manufacturing the same. In particular, the present invention relates to, for example, an energy-trapping type piezoelectric element which uses thickness extensional vibration with respect to an oriented ceramic and a method for manufacturing the same.

2. Description of the Related Art

Energy-trapping type piezoelectric element are known. In this type of element, vibration electrodes are arranged in a piezoelectric body, and high-order vibration of the thickness extensional vibration is excited. It is clear that this type of piezoelectric element is hardly affected by the Poisson ratio in contrast to that which excites fundamental vibration of the thickness extensional vibration. In general, a material which exhibits excellent thermal stability, such as a lead titanate-based material, has a Poisson ratio of less than $\frac{1}{3}$, and frequency-lowering type energy-trapping of a fundamental of the thickness vibration is impossible. For a high-order vibration of the thickness vibration excited by the structure of the vibration electrodes, excellent frequency-lowering type energy-trapping can be realized even when such a thermally stable material is used, and therefore, this technology is noted being capable of providing a commercial high-performance piezoelectric element.

In addition, it is known that an oriented ceramic, i.e., one in which crystal grains are oriented, is useful as the ceramic used in an electronic material, for example, a piezoelectric material. Orientation refers to a condition in which at least one axis of each of the crystal grains is preferentially aligned in the same direction as a whole. For example, as is clear from the report by T. Takenaka et al., regarding a piezoelectric material, the electromechanical coupling coefficient is increased to about 2.2 times that of a usual randomly-oriented ceramic in longitudinal vibration of a cylindrical vibrator by bringing a layer perovskite compound ceramic, for example, $Na_{0.5}Bi_{4.5}Ti_4O_{15}$, into orientation (Sensor and Materials, Vol. 1, 35 (1998)). As is reported by S. Jin et al., regarding a superconducting material, the critical current density is increased to about 12 times that of a randomly-oriented ceramic by preparing an oriented ceramic of $YBa_2Cu_3O_7$-$\delta$ (Physical Review B, vol. 37, No. 13, 7850 (1988)).

Examples of conventional methods for manufacturing an oriented ceramic include, for example, a hot-forging method and a Templated Grain Growth (TGG) method. T. Takenaka et al. prepared the oriented $Na_{0.5}Bi_{4.5}Ti_4O_{15}$ ceramic by using the hot-forging method. Hot-forging is a method in which a molding is heat-treated (fired) under pressure. An oriented ceramic having a high degree of orientation can be produced by this method. At this time, the degree of orientation of the oriented ceramic reaches 98% when measured by the Lotgering method. Seong-Hyeon Hong et al. prepared an oriented $Bi_4(Ti_{3.96}Nb_{0.04})O_{12}$ ceramic by using the TGG method. The TGG method is a method in which ceramic crystal grains having anisotropy are mixed in advance of molding. The degree of orientation of the oriented ceramic produced by this method is 96% when measured by the Lotgering method, and the piezoelectric constant d33 is increased to about 1.5 times that of a randomly-oriented ceramic (J. Am. Ceram. Soc. Vol. 83, 113, (2000)).

Conventionally, it was difficult to manufacture the energy-trapping type piezoelectric element in which vibration electrodes were arranged in a piezoelectric body, as high-order vibration of the thickness vibration was excited, and the piezoelectric ceramic used therefor had a polarization axis present in the major-axis direction of the crystal grain having shape anisotropy, while the crystal grain was oriented in the direction perpendicular to the vibration electrode surface. In particular, it was easy to manufacture a ceramic compound having a layer perovskite structure, in which the c axis of the orthorhombic system was preferentially oriented by using the hot-forging method, the TGG method and the like. However, the direction suited for polarization is the a axis, and it was difficult to form vibration electrodes in the piezoelectric body in the direction perpendicular to the a axis in order to apply an excitation electric field in the direction of spontaneous polarization.

For example, since uniaxial pressure is applied during firing in the hot-forging method, the resulting molding is crushed and is significantly deformed. Consequently, even when the electrodes were arranged beforehand in the piezoelectric body, deviation from the original location of the electrodes was significant, reducing the ability to the element to be manufactured by the hot-forging method.

In the TGG method, a green sheet is prepared by a sheet molding method, electrodes are printed on the green sheet, and thereafter, the green sheets are laminated, followed by pressure bonding, so that the electrodes can be precisely formed in the piezoelectric body. However, since the c axis orientation is brought about in the direction perpendicular to the traveling direction of a carrier film during sheet molding in the TGG method, the preferentially oriented a(b) axis and the vibration electrodes become perpendicular to each other. In the TGG method, the c axis is an axis unsuited for polarization, and the remnant polarization is very small. Therefore, there is a problem in that the piezoelectric property is hardly attained.

SUMMARY OF THE INVENTION

Accordingly, it is a major object of the present invention to provide a laminate type piezoelectric element having an improved piezoelectric property, the piezoelectric element being of the type in which vibration electrodes are arranged in a piezoelectric body, and high-order vibration of the thickness vibration is excited, and to provide a method for manufacturing the same.

A piezoelectric element according to an aspect of the present invention includes a ceramic piezoelectric layer containing ceramic crystal grains having shape anisotropy and spontaneous polarization preferentially oriented in one plane and at least three vibration electrodes arranged facing one another with the ceramic piezoelectric therebetween in order to excite vibration. In the aforementioned piezoelectric element, an in-plane direction of the plane is arranged nearly perpendicularly to the vibration electrodes, and thickness extensional harmonics of the order n (where n denotes a natural number of 2 or more) are excited in the region at which at least three vibration electrodes overlap one another.

In the present invention, "ceramic crystal grain having shape anisotropy" refers to a crystal grain having a large ratio of the major axis dimension of the grain to the minor axis dimension, such as a powder in the shape of a plane, a strip, a column, a needle or a scale. In the present invention, "direction of spontaneous polarization of a ceramic crystal grain" refers to the direction in which directions of dipoles present disorderly in each crystal grain constituting a polycrystalline ceramic are nearly aligned by application of a direct-current electric field due to a polarization treatment. Furthermore, in the present invention, "spontaneous polarization is preferentially oriented in one plane" refers to that directions of spontaneous polarization of ceramic crystal grains which are included nearly in one plane, and therefore, there is almost no component in the direction of the normal to the plane.

Examples of ceramic crystal grains used in the present invention include, for example, $Bi_4Ti_3O_{12}$ having a bismuth layer perovskite structure. As is clear from research on a $Bi_4Ti_3O_{12}$ single crystal by S. E. Cummins et al., the direction of spontaneous polarization is nearly in the a axis direction of the orthorhombic system in the bismuth layer perovskite structure (Journal of Applied Physics Vol. 39, 2268 (1968)). In the bismuth layer perovskite structure, the a axis and the b axis of a crystal in ferroelectric phase have a nearly equal length, and according to Aurivillus, b/a=1.007 in $Bi_4Ti_3O_{12}$ (Ark. Kemi Vol. 1, 499 (1949)). Even when a direct-current electric field of a polarization treatment is applied in the b axis direction, the crystal structure is changed so that the a axis direction becomes the direction of the direct-current electric field, and thereby, the direction of spontaneous polarization can be changed into the direction of the electric field due to the polarization treatment. Consequently, the direction of spontaneous polarization presents nearly in the plane including the a axis and the b axis. Regarding the bismuth layer perovskite structure, such as $Bi_4Ti_3O_{12}$, the crystal grain is primarily in the shape of a plate, and since the principal surface and the c axis of the plate-like crystal grain are perpendicular to each other, the direction of spontaneous polarization becomes the direction parallel to the principal surface of the plate-like crystal grain. Regarding the bismuth layer perovskite structure, that the direction of spontaneous polarization of a ceramic crystal grain is nearly perpendicular to a vibration electrode refers to the condition in which the principal surface of the plate-like crystal grain parallel to the plane including the a axis and the b axis is nearly perpendicular to the electrode.

In the piezoelectric element according to the present invention, spontaneous polarization of the ceramic crystal grain having shape anisotropy contained in the ceramic piezoelectric layer is preferentially oriented in one plane, and the in-plane direction of the plane is arranged nearly perpendicular to the vibration electrodes. Consequently, the polarization axis is oriented in the direction nearly perpendicular to the vibration electrodes, and thereby, the piezoelectric property is improved.

In the piezoelectric element according to the present invention, the ceramic crystal grain having shape anisotropy preferably has a layer perovskite structure. Examples of materials having the layer perovskite structure include, for example, $BiWO_6$, $CaBi_2Nb_2O_9$, $SrBi_2Nb_2O_9$, $BaBi_2Nb_2O_9$, $PbBi_2Nb_2O_9$, $CaBi_2Ta_2O_9$, $SrBi_2Ta_2O_9$, $BaBi_2Ta_2O_9$, $PbBi_2Ta_2O_9$, $Bi_3TiNbO_9$, $Bi_3TiTaO_9$, $Bi_4Ti_3O_{12}$, $SrBi_3Ti_2NbO_{12}$, $BaBi_3Ti_2NbO_{12}$, $PbBi_3Ti_2NbO_{12}$, $CaBi_4O_{15}$, $SrBi_4Ti_4O_{15}$, $BaBi_4Ti_4O_{15}$, $PbBi_4Ti_4O_{15}$, $Na_{0.5}Bi_{4.5}Ti_4O_{15}$, $K_{0.5}Ti_4O_{15}$, $Ca_2Bi_4Ti_5O_{18}$, $Sr_2Bi_4Ti_5O_{18}$, $Ba_2Bi_4Ti_5O_{18}$, $Pb_2Bi_4Ti_5O_{18}$, $Bi_6Ti_{30}$ and $Sr_2Nb_2O_7$.

In the piezoelectric element according to the present invention, the ceramic crystal grain having shape anisotropy is preferably in the shape of a plate. When the ceramic crystal grain is in the shape of a plate, the principal surfaces of the plate-like ceramic crystal grains can be easily aligned in one plane using the TGG method.

In the piezoelectric element according to the present invention, the aspect ratio L/H of the ceramic crystal grain having shape anisotropy is preferably about 3 or more, where the aspect ratio is the ratio of a major axis dimension L to a minor axis dimension H. When the aspect ratio is less than about 3, it is difficult to align the directions of the ceramic crystal grains through the use of the shape anisotropy during the molding since the shape anisotropy of the ceramic crystal grain is reduced, and therefore, it is difficult to align the spontaneous polarization of the ceramic crystal grains.

In the piezoelectric element according to the present invention, when the surface of the ceramic piezoelectric layer parallel to the vibration electrode is measured by an X-ray diffraction method, the peak intensity ratio I/I0 is preferably about 1.0 or more, where I represents the highest peak intensity resulting from a crystal face perpendicular to the direction of spontaneous polarization of the ceramic crystal grain, and I0 represents the peak intensity resulting from the crystal face from which the highest peak intensity can be attained in a ceramic powder having the same composition as that of the ceramic crystal grain. The component of the direction of spontaneous polarization, perpendicular to the plane parallel to the electrode surface, is increased with an increase in the ratio I/I0 and with an increase in the peak intensity resulting from the crystal face perpendicular to the direction of spontaneous polarization.

A method for manufacturing a piezoelectric element according to another aspect of the present invention is a method for manufacturing the piezoelectric element which includes the steps of preparing a ceramic slurry containing ceramic crystal grains having shape anisotropy and a powder of the ceramic raw material or a calcined powder of the ceramic material, forming a plate-like molding having an axis suited for polarization in a direction orthogonal to the thickness direction by molding the ceramic slurry, cutting the molding into the shape of a strip in the direction nearly parallel to the thickness direction, adhering the cut strip-like moldings into the shape of a plate in such a manner that cut surfaces are not brought into surface-contact with each other, forming an electrode on the cut surface of the molding adhered in the shape of a plate, forming a laminate by laminating the moldings adhered in the shape of a plate, forming a fired material by firing the laminate, and performing a treatment for polarizing the fired material in the direction perpendicular to the electrode surfaces by applying a direct-current electric field to the fired material in the direction perpendicular to the electrode surfaces.

A method for manufacturing a piezoelectric element according to another aspect of the present invention is a method for manufacturing the piezoelectric element which includes the steps of preparing a ceramic slurry containing ceramic crystal grains having shape anisotropy and a powder of the ceramic raw material or a calcined powder of the ceramic material, forming a block-like molding having an axis suited for polarization in a direction orthogonal to one direction by molding the ceramic slurry, cutting the molding into the shape of a plate in the direction nearly parallel to the one direction, forming an electrode on the cut surface of the molding cut into the shape of a plate, forming a laminate by laminating the moldings cut into the shape of a plate, forming a fired material by firing the laminate, and performing a treatment for polarizing the fired material in the direction perpendicular to the electrode surfaces by applying a direct-current electric field to the fired material in the direction perpendicular to the electrode surfaces.

A method for manufacturing a piezoelectric element according to another aspect of the present invention is a method for manufacturing the piezoelectric element which includes the steps of preparing a ceramic slurry containing ceramic crystal grains having shape anisotropy and a powder of the ceramic raw material or a calcined powder of the ceramic material, forming a block-like molding having an axis suited for polarization in a direction orthogonal to one direction by molding the ceramic slurry, forming a fired material by firing the molding, cutting the fired material into the shape of a plate in the direction nearly parallel to the one direction, forming an electrode on the cut surface of the fired material cut into the shape of a plate, forming a laminate by laminating the fired materials cut into the shape of a plate, and performing a treatment for polarizing the laminate in the direction perpendicular to the electrode surfaces by applying a direct-current electric field to the laminate in the direction perpendicular to the electrode surfaces.

The piezoelectric elements according to the present invention are manufactured by the aforementioned methods for manufacturing a piezoelectric element according to the present invention.

Since the piezoelectric element according to the present invention is allowed to have a laminated structure, there is an advantage from the viewpoint of an increase in frequency in consideration of the element size. That is, the thickness of a piezoelectric element must generally be reduced in order to be used in higher frequencies. However, when the piezoelectric element is allowed to have a laminated structure as in the present invention, the thickness of the portion to be vibrated can be reduced compared with that of the element having the same thickness since the vibration electrode is provided in the inside, and therefore, the use in higher frequencies becomes possible.

Furthermore, since the ceramic piezoelectric layer is oriented in the direction nearly perpendicular to the vibration electrode in the piezoelectric element according to the present invention, the value of the remnant polarization becomes larger than that of the conventional piezoelectric element using a randomly-oriented ceramic piezoelectric layer, and the electromechanical coupling coefficient is increased, and therefore, applications to, for example, wideband and middle-band filters become possible. Conventionally, it was difficult to form a laminate of the ceramic piezoelectric layers in which that the axis suited for spontaneous polarization and the vibration electrodes became perpendicular to each other even when the ceramic piezoelectric layer was oriented. Conventionally, the ceramic piezoelectric layers were able to be laminated so that an axis suited for spontaneous polarization and an internal electrode became parallel to each other. However, it was not able to attain an excellent piezoelectric property by the aforementioned lamination. On the other hand, in the present invention, ceramic piezoelectric layers can be laminated in an orientation condition in which the axis suited for spontaneous polarization and the internal electrode become nearly perpendicular to each other, and an excellent piezoelectric property can be attained.

The aforementioned objects, other objects, features and advantages of the present invention will be made clearer from the following detailed description of the embodiments of the invention with reference to the drawings.

DESCRIPTION OF THE PREFERRED EMBODIMENTS

Figure 1:
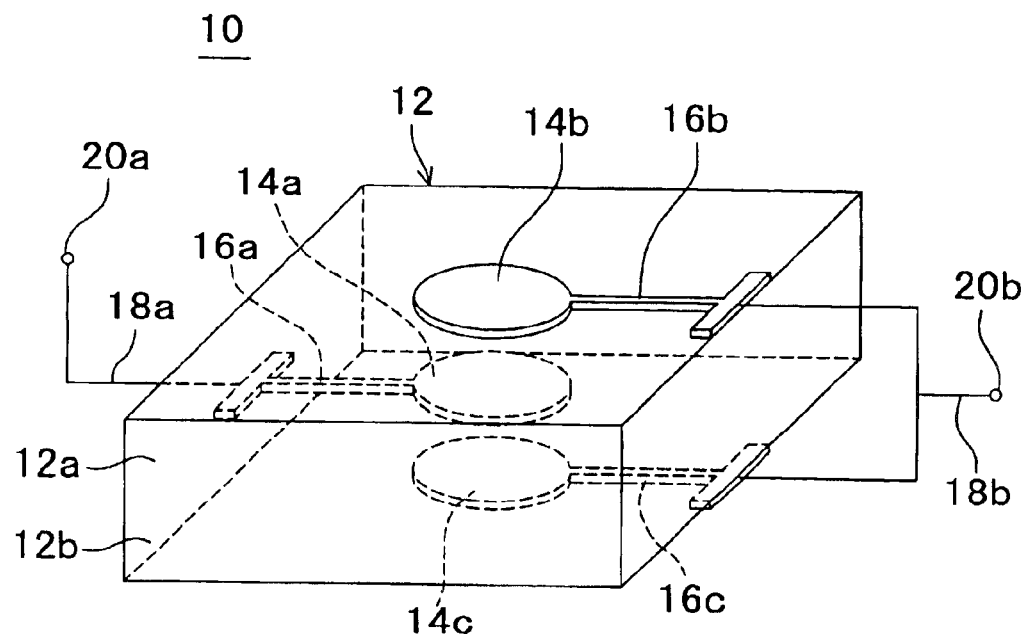
FIG. 1 is a perspective view showing an example of a piezoelectric element according to the present invention.
Figure 2:
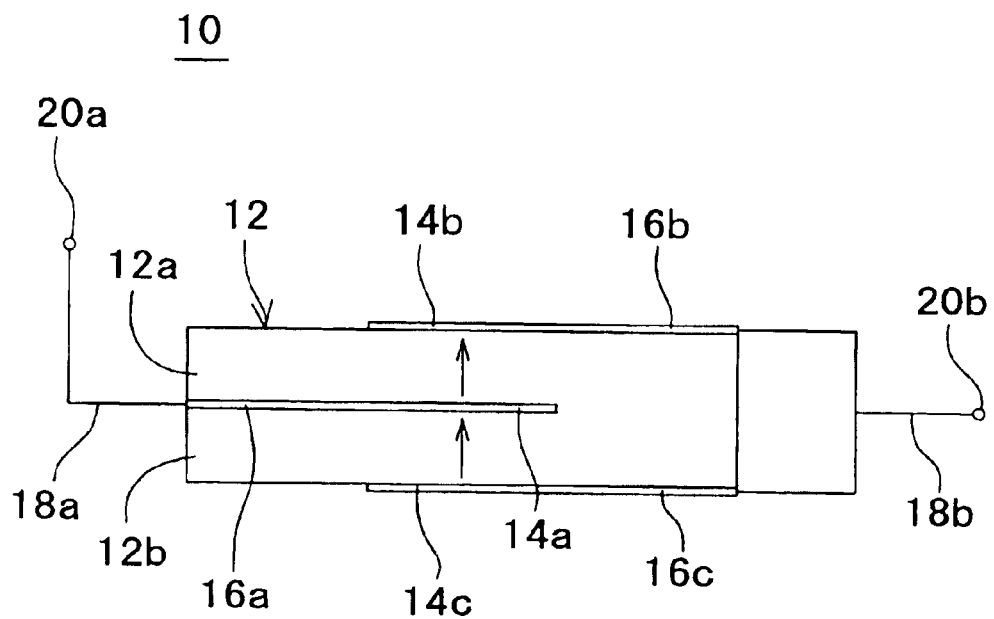
FIG. 2 is a sectional view illustrating the piezoelectric element shown in FIG. 1.

FIG. 1 is a perspective view showing an example of a piezoelectric element according to the present invention, and FIG. 2 is a sectional view illustrating the same. A piezoelectric element 10 shown in FIG. 1 and FIG. 2 includes a piezoelectric ceramic 12 in the shape of, for example, a rectangular parallelepiped. The piezoelectric ceramic 12 includes two ceramic piezoelectric layers 12a and 12b.

These ceramic piezoelectric layers 12a and 12b are laminated, and are integrally formed. Each of these ceramic piezoelectric layers 12a and 12b contains ceramic crystal grains having shape anisotropy and spontaneous polarization preferentially oriented in one plane. The in-plane direction of this plane is nearly perpendicular to the principal surfaces of the ceramic piezoelectric layers 12a and 12b. Furthermore, these ceramic piezoelectric layers 12a and 12b are polarized in the same thickness direction, as indicated by arrows shown in FIG. 2.

A vibration electrode 14a in the shape of a circle, for example, is arranged at the midpoint between the ceramic piezoelectric layers 12a and 12b, and a lead electrode 16a in the shape of, for example, a letter T is arranged from the vibration electrode 14a to one end surface of the piezoelectric ceramic 12. A vibration electrode 14b in the shape of a circle, for example, is arranged at the center of the surface of the ceramic piezoelectric layer 12a, and a lead electrode 16b in the shape of, for example, a letter T is arranged from the vibration electrode 14b to the other end surface of the piezoelectric ceramic 12. Furthermore, a vibration electrode 14c in the shape of a circle, for example, is arranged at the center of the surface of the ceramic piezoelectric layer 12b, and a lead electrode 16c in the shape of, for example, a letter T is arranged from the vibration electrode 14c to the other end surface of the piezoelectric ceramic 12. These vibration electrodes 14a to 14c are arranged facing one another with the ceramic piezoelectric layers 12a and 12b therebetween in order to excite vibration. The lead electrodes 16a to 16c may be individually formed into the shape of a letter I, for example.

The lead electrode 16a is connected to one external electrode 20a via a lead wire 18a, and the lead electrodes 16b and 16c are connected to the other external electrode 20b via another lead wire 18b.

In this piezoelectric element 10, second-order thickness extensional harmonics are excited in the region at which the vibration electrodes 14a to 14c overlap one another.

A method for manufacturing the aforementioned piezoelectric element 10 will be described below.

EXAMPLE 1

Figure 3:
FIG. 3 is a diagram showing steps for manufacturing a crystal grain having shape anisotropy, used for the piezoelectric element shown in FIG. 1.
Figure 4:
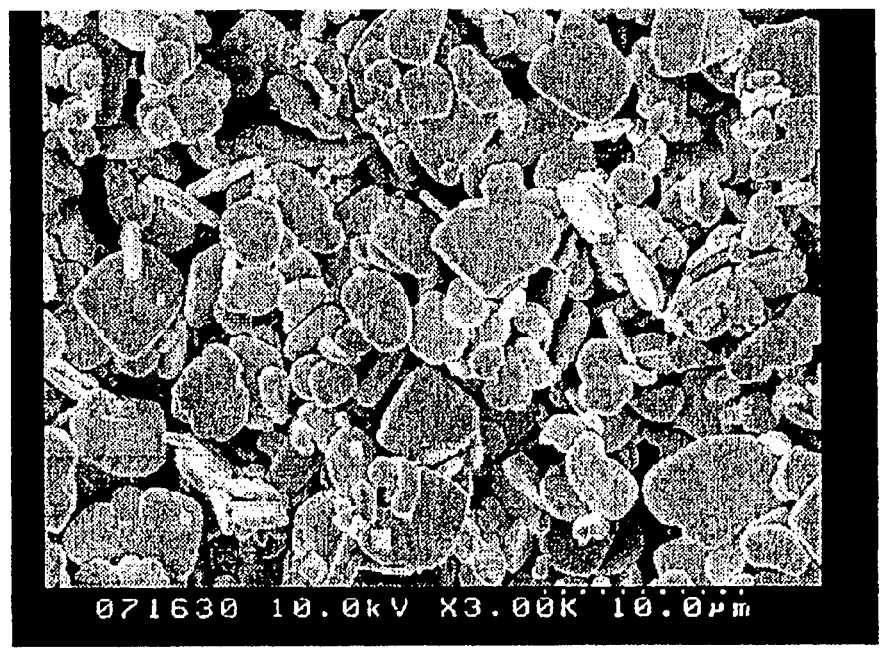
FIG. 4 is an electron micrograph showing plate-like crystal grains of $CaBi_4Ti_4O_{15}$.

$Bi_2O_3$, $TiO_2$, $CaCO_3$ and $MnCO_3$ were prepared as starting materials. These were weighed in order that the composition became $CaBi_4Ti_4O_{15}$+0.5% by weight of $MnCO_3$, and were wet-mixed in a ball mill for about 16 hours so as to produce a mixture. The resulting mixture was dried, and thereafter, was calcined at 900° C. for 2 hours so as to produce a calcined powder of the ceramic material. Subsequently, the calcined powder was mixed with KCl as flux at a ratio of 1:1 on a weight basis, and a heat treatment was performed at 900° C. to 1,100° C. for 10 hours. In this case, the heat treatment was performed at a temperature at which the flux was molten and the calcined powder grew as grains. After the heat treatment, KCl was removed by water washing, and therefore, a ceramic powder of $CaBi_4Ti_4O_{15}$ was produced. It was verified with a scanning electron microscope that this ceramic powder had shape anisotropy and was in the shape of a plate. This ceramic powder does not cause coagulation, adhesion and the like, and is in a condition in which each grain is independent of other grains. FIG. 3 is a diagram showing steps for manufacturing the crystal grain having shape anisotropy. FIG. 4 is an electron micrograph showing plate-like crystal grains of $CaBi_4Ti_4O_{15}$. This plate-like ceramic powder had an aspect ratio L/H in the order of 10, where the aspect ratio is the ratio of the maximum diameter (major axis dimension L) thereof to the height (minor axis dimension H).

Figure 5:
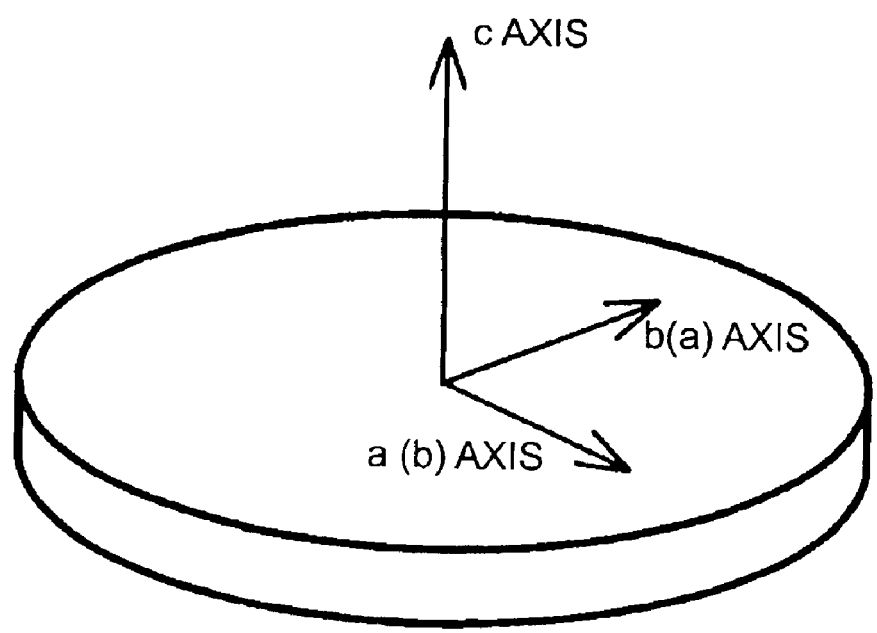
FIG. 5 is a perspective view showing a crystal grain of a Bi layer compound.
Figure 6:
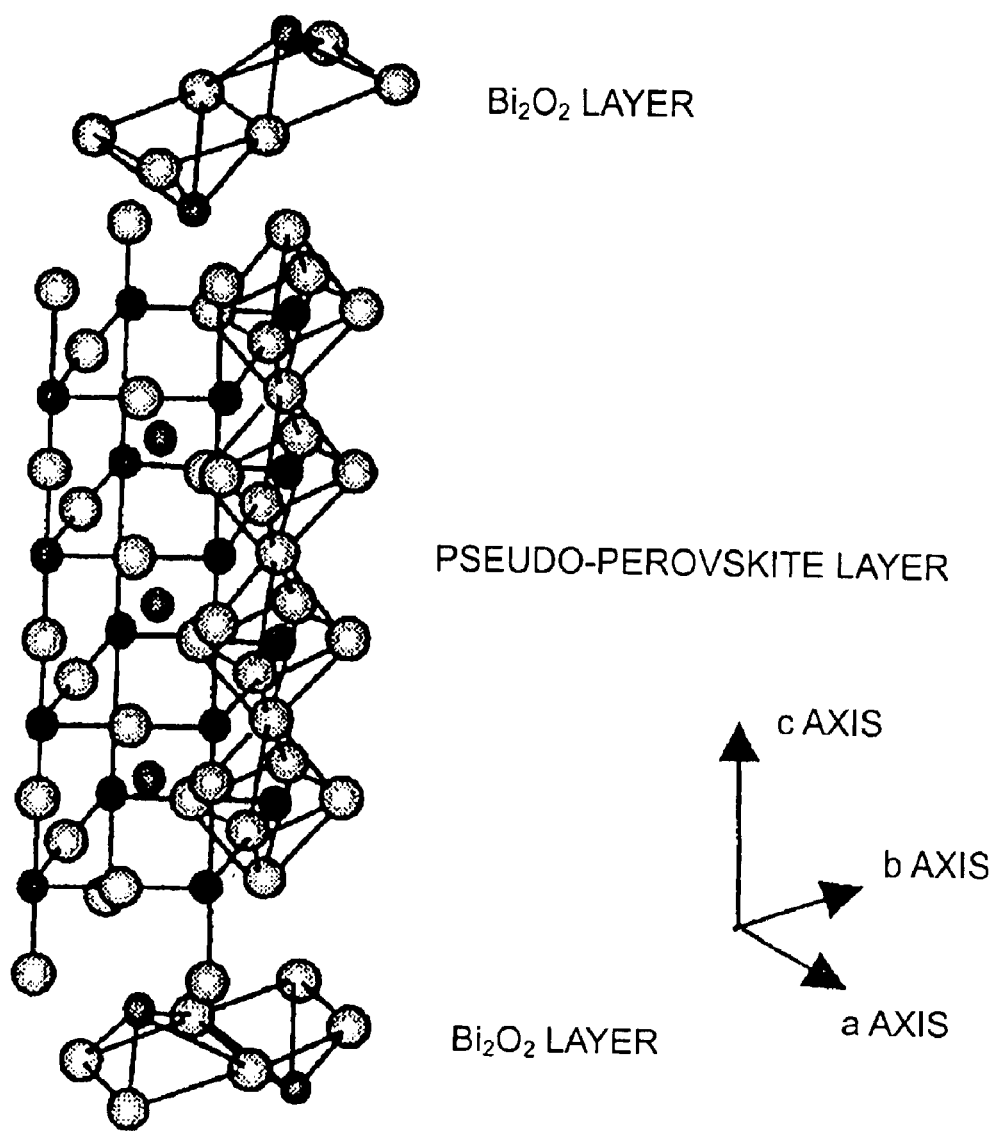
FIG. 6 is a diagram illustrating the crystal structure of the Bi layer compound.

Next the crystal grain having shape anisotropy will be described. In many cases, a Bi layer compound becomes a plate-like crystal grain, as shown in FIG. 5. The reason for this is considered to be that the crystal structure of this material is as shown in FIG. 6, and a layer structure is composed of $Bi_2O_2$ layers in which a pseudo-perovskite layer is incorporated. The c axis of the crystal is believed to be parallel to the direction perpendicular to the principal surface of the plate-like crystal grain (and this is also clear from the result of an XRD analysis). The direction of spontaneous polarization is primarily in the a axis direction. Some Bi layer compounds also have a polarization component in the c axis direction, but the amount of the component is very small. $CaBi_4Ti_4O_{15}$ used in Example 1 is believed to have no spontaneous polarization component in the c axis direction. The a axis and the b axis in the plate-like crystal grain are believed to be directed in directions parallel to the principal surface of the plate-like crystal grain. However, it is also believed that the a axis and the b axis are directed in random directions parallel to the principal surface before the polarization treatment, and therefore, the total value of the spontaneous polarization of the plate-like crystal grain becomes zero. Since polarization cannot be brought about in the c axis direction, the direction suited for spontaneous polarization is the direction parallel to the principal surface of the plate-like crystal grain, and every direction parallel to the principal surface of the plate-like crystal grain is the direction suited for spontaneous polarization.

Subsequently, a powder mixture of 50 parts by weight of the aforementioned plate-like ceramic powder and 50 parts by weight of the aforementioned calcined powder, and an appropriate amounts of organic binder, dispersing agent, antifoaming agent and surfactant were mixed so as to produce a ceramic slurry.

Figure 7:
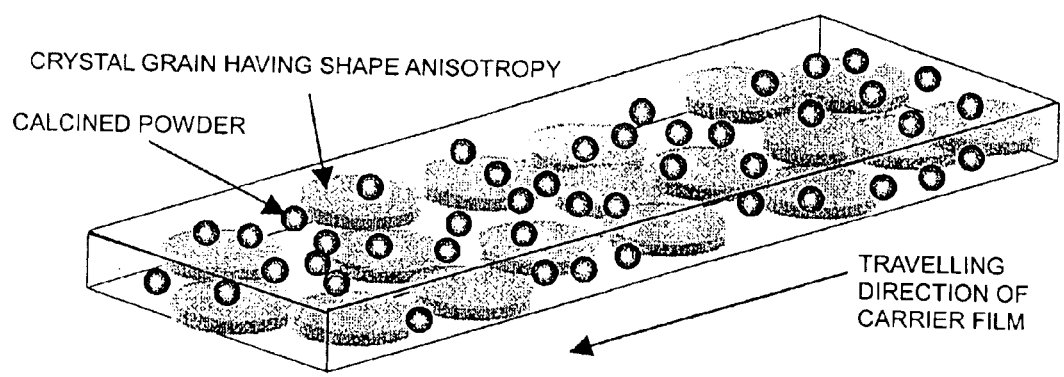
FIG. 7 is a diagram illustrating the internal structure of a sheet after sheet molding.

This ceramic slurry was sheet molded by a doctor blade method, and a rectangular sheet 30 was produced as a molding. The inside of the sheet after this sheet molding has a structure shown in FIG. 7. That is, since the crystal grain having shape anisotropy is in the shape of a plane, the plate-like principal surface thereof and the direction of extension of the sheet are nearly parallel to each other. As a matter of course, the crystal grain having shape anisotropy and the calcined powder are the same material. Although the direction parallel to the principal surface of the crystal grain having shape anisotropy is the direction suited for spontaneous polarization, when the sheet is molded, the structure is as shown in FIG. 7, and therefore, every direction of the extension of the sheet is the direction suited for spontaneous polarization. However, the thickness direction of the sheet is the c axis direction, which is a direction unsuited for spontaneous polarization, and thereby, the polarization treatment is difficult. The thickness of this sheet 30 was 40 ⊚m to 100 ⊚m. A sheet 30 has the axis suited for spontaneous polarization in the direction indicated by arrows shown in FIG. 8, that is, in-plane direction orthogonal to the thickness direction. Likewise, the direction of the axis suited for spontaneous polarization is indicated by arrows in the other drawings.

Figure 8:
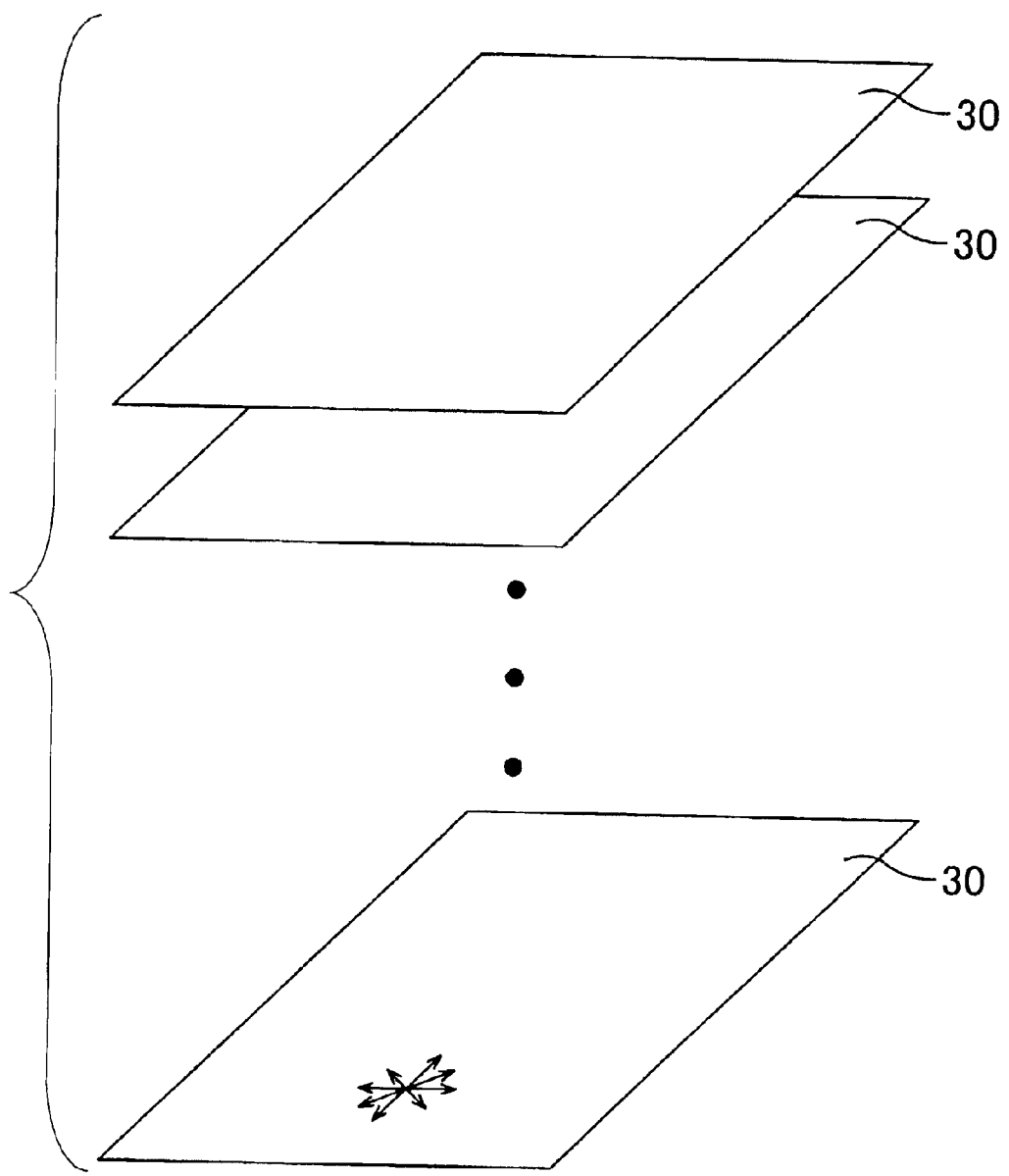
FIG. 8 is a diagram illustrating a step in Example 1.
Figure 9:
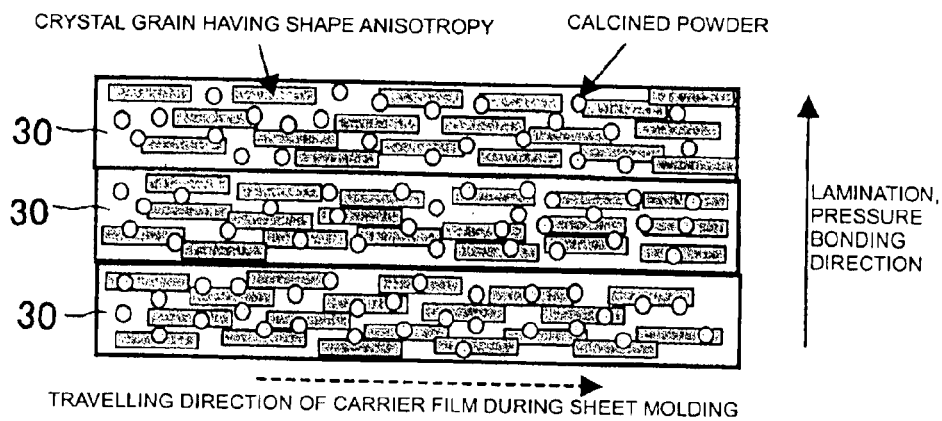
FIG. 9 is a diagram illustrating a condition in which sheets are laminated, and are pressure-bonded.
Figure 10:
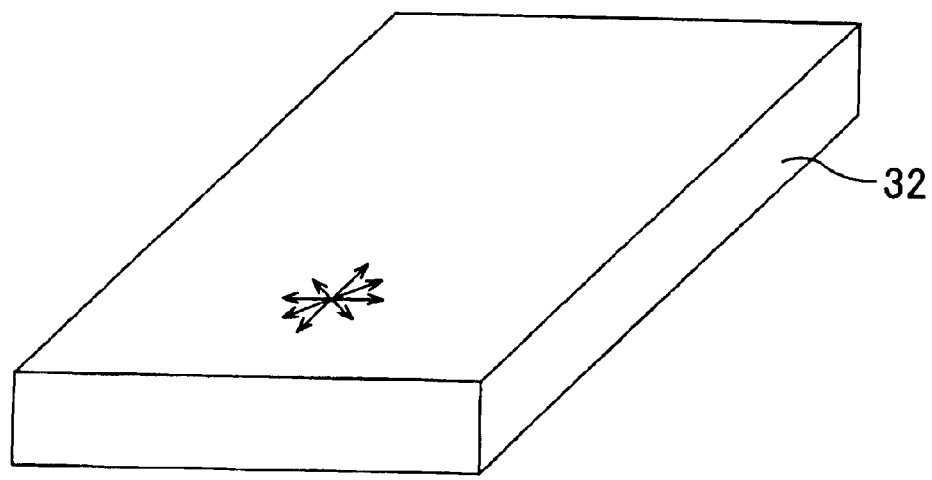
FIG. 10 is a perspective view showing another step in Example 1.
Figure 11:
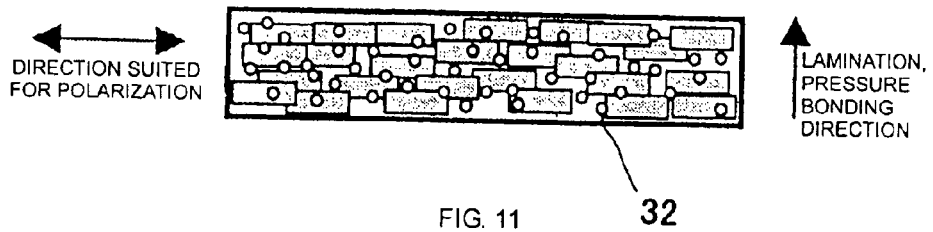
FIG. 11 is a diagram illustrating the condition shown in FIG. 10.

As shown in FIG. 8 and FIG. 9, a plurality of sheets 30 were laminated, and were pressure-bonded in order to have a thickness in the order of 1 mm, and therefore, as shown in FIG. 10 and FIG. 11, a plate-like molding 32 pressure-bonded to have a thickness in the order of 0.8 mm was produced. It is clear that in this lamination, the pressure bonding direction and the direction suited for spontaneous polarization are perpendicular to each other in this condition.

Figure 12:
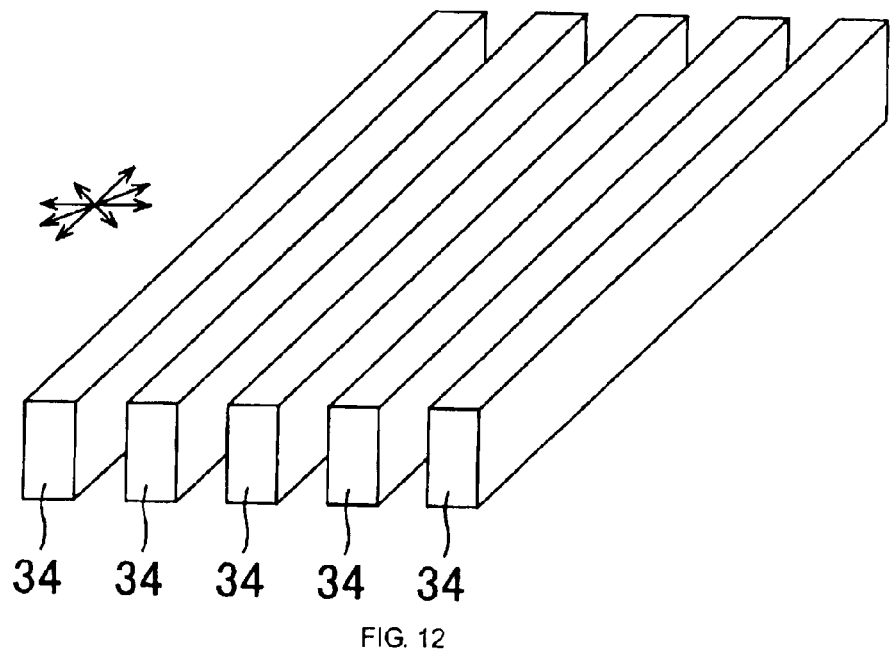
FIG. 12 is a perspective view showing another step in Example 1.
Figure 13:
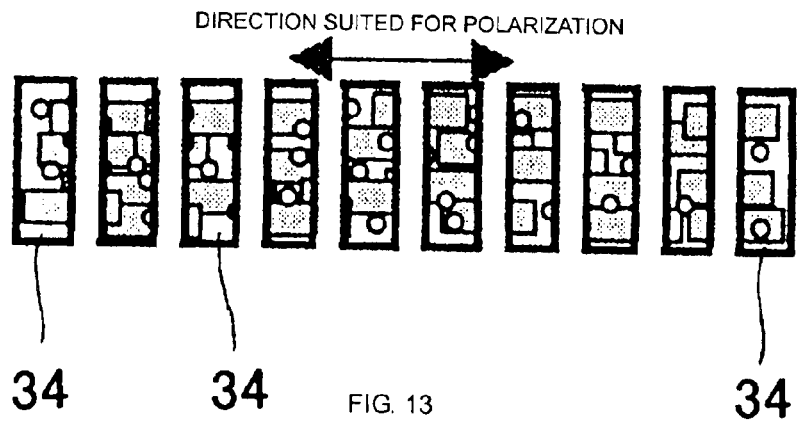
FIG. 13 is a diagram illustrating the condition shown in FIG. 12.

As shown in FIG. 12 and FIG. 13, the plate-like molding 32 was cut in the direction parallel to the lamination direction of the sheets 30, and therefore, a plurality of strip-like moldings 34 of 0.5 mm in width were produced.

Figure 14:
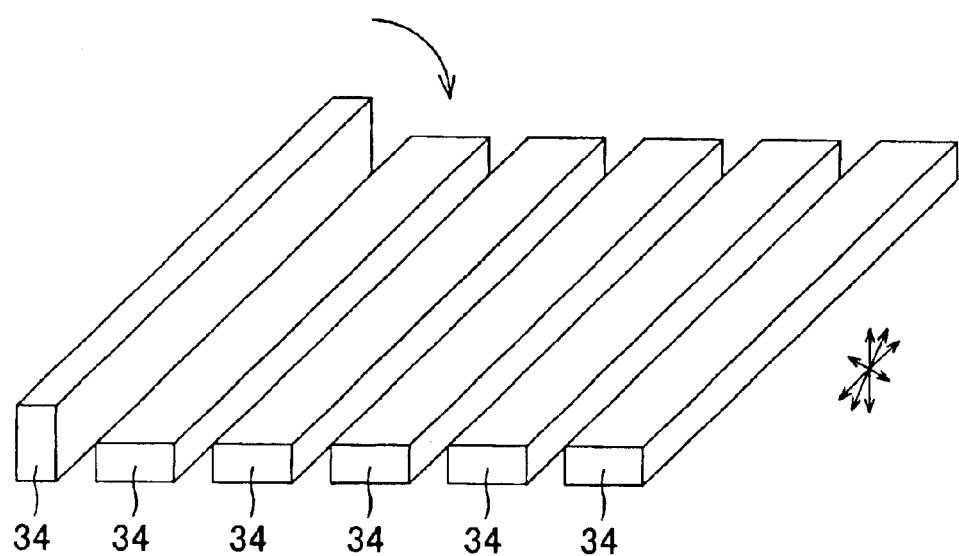
FIG. 14 is a perspective view showing another step in Example 1.
Figure 15:
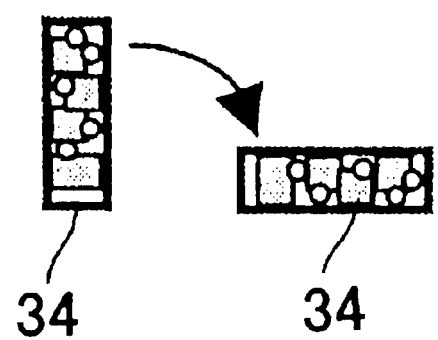
FIG. 15 is a diagram illustrating the condition shown in FIG. 14.
Figure 16:
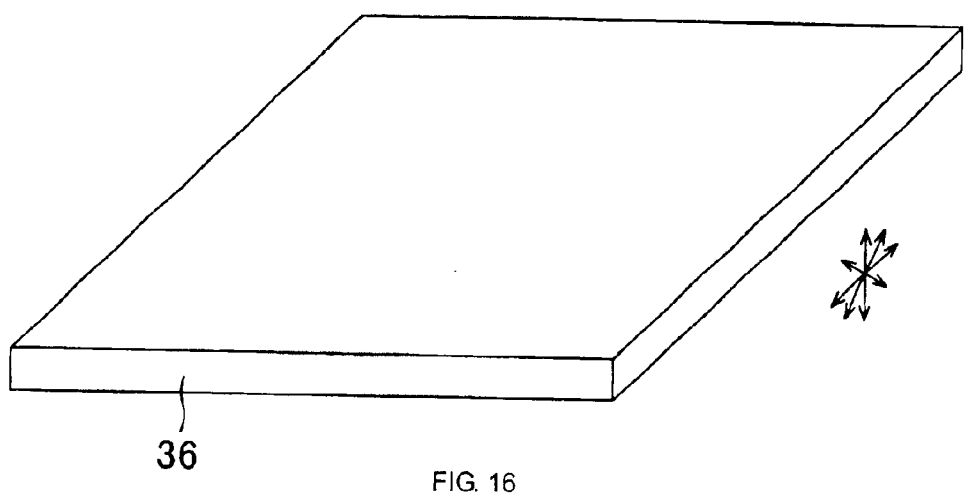
FIG. 16 is a perspective view showing another step in Example 1.
Figure 17:
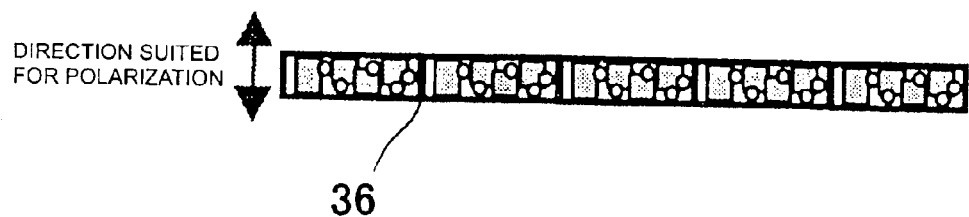
FIG. 17 is a diagram illustrating the condition shown in FIG. 16.

As shown in FIG. 14 and FIG. 15, the strip-like moldings 34 were inclined 90°, and were laid with no clearance therebetween in a mold, followed by pressure bonding. That is, the pressure bonding was performed in the condition in which the cut surface of the strip-like molding 34 and the application direction of the pressure during the pressure bonding were perpendicular to each other. In this manner, the strip-like moldings were adhered with each other so as to produce a plate-like molding 36, as shown in FIG. 16 and FIG. 17. The direction parallel to the principal surface of this plate-like molding 36 is a direction parallel to the lamination direction of the sheets 30.

Figure 18:
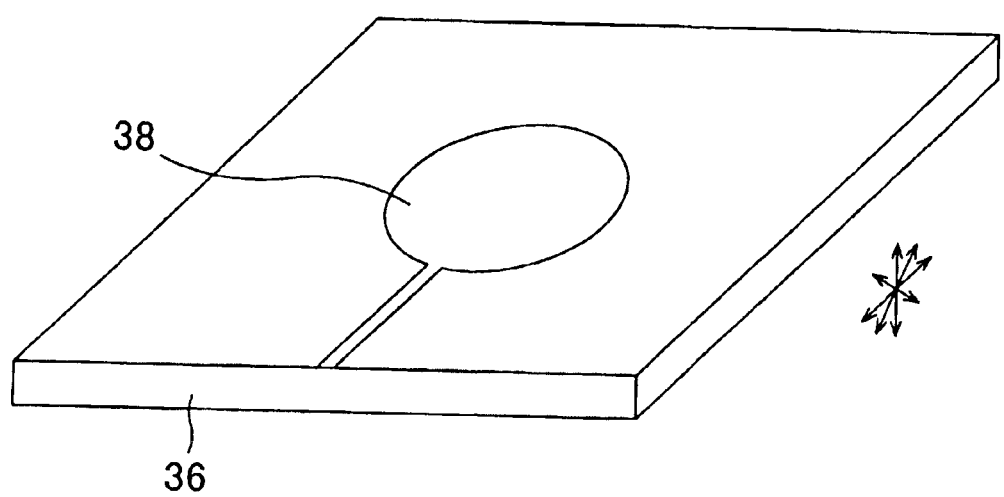
FIG. 18 is a perspective view showing another step in Example 1.

As shown in FIG. 18, an electrode 38 made of Pt was formed on the principal surface of this plate-like molding 36 by printing followed by drying.

Figure 19:
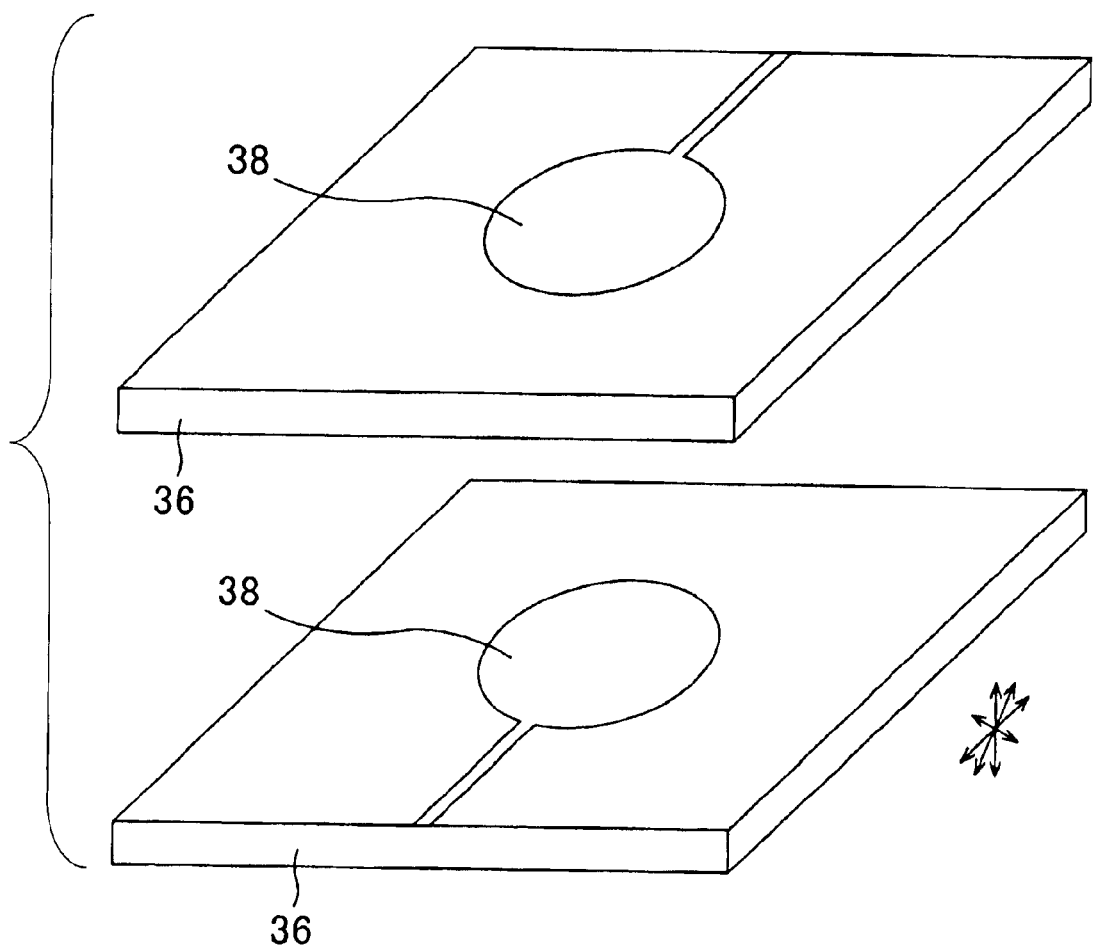
FIG. 19 is a perspective view showing another step in Example 1.
Figure 20:
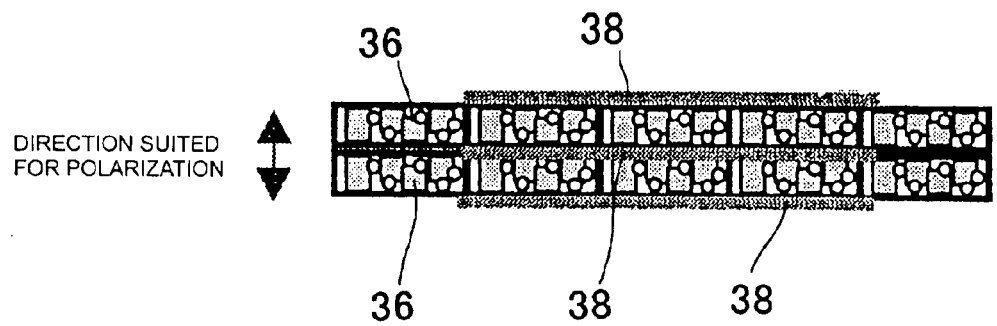
FIG. 20 is a diagram illustrating a condition in which moldings provided with electrodes are laminated, and are pressure-bonded.

As shown in FIG. 19 and FIG. 20, the plate-like moldings provided with the electrode 38 were laminated, and were pressure-bonded so as to form a laminate. This laminate included two moldings 36 laminated, and electrodes 38 were arranged on the top surface and the bottom surface of the two moldings 36 and between the two moldings 36. Regarding the laminate, the direction suited for spontaneous polarization and the planes of the electrodes 38 are in the relationship of being perpendicular to each other.

Subsequently, the laminate was sintered by firing at 1,150° C. for 2 hours so as to form a fired body. The fired body was subjected to a polarization treatment between the electrodes 38 in the thickness direction of the molding 36 in silicone oil under the conditions of 150° C. to 200° C., 8 to 10 kV/mm and 10 to 30 minutes, and therefore, a piezoelectric element 10 provided with vibration electrodes inside and outside the piezoelectric ceramic was manufactured.

A surface of the piezoelectric ceramic 12 of the piezoelectric element 10 manufactured in Example 1 was subjected to light polishing while the surface was parallel to the electrode surfaces, and the peak intensity of each crystal face was measured by an X-ray diffraction method (radiation source CuKα, 30 kV and 15 mA). As a result, the direction of spontaneous polarization and the a axis were nearly parallel to each other, and the highest peak intensity I resulting from the crystal face in the perpendicular direction was 2,208 cps, that was reflection from the (020) plane.

The peak intensity of each crystal face of the ceramic powder having the same composition as that of the piezoelectric ceramic 12 was also measured in a manner similar to that described above. As a result, it was verified that the highest peak intensity was assigned to the reflection from the (119) plane. When the crystal face parallel to the electrode surfaces in the piezoelectric ceramic 12 of the piezoelectric element 10 was measured, the peak intensity I0 of the reflection intensity from the (119) plane was 1,373 cps.

Therefore, the ratio I/I0 of the peak intensity I to the peak intensity I0 was 1.61 for the piezoelectric element 10 manufactured in Example 1.

In order to evaluate the piezoelectric property of the piezoelectric element 10 manufactured in Example 1, the electromechanical coupling coefficient k of the second-order harmonics of the thickness extensional vibration was measured with an impedance analyzer HP4194A by a resonance-antiresonance method with the result that the k was 20%.

A randomly-oriented sample was manufactured as a comparative example in order to compare the piezoelectric property with that of the piezoelectric element 10 manufactured in Example 1. A calcined powder of the ceramic material, which was the same as the calcined powder of the ceramic material prepared in Example 1, was prepared through the same steps as those in Example 1. An appropriate amounts of organic binder, dispersing agent, antifoaming agent and surfactant were mixed into this calcined powder so as to produce a ceramic slurry. This ceramic slurry was sheet molded by a doctor blade method, and therefore, a sheet was produced as a molding. The thickness of this sheet was 40 ⊚m to 100 ⊚m. An electrode made of Pt was formed on the principal surface of this sheet by printing, and the sheets were laminated so as to form a laminate. This laminate included an electrode between the laminated sheets, and in addition, included an electrode on each of both surfaces of the laminated sheets. This laminate was fired at 1,150° C. for 2 hours so as to form a fired body. This fired body was subjected to a polarization treatment in the thickness direction of the sheet in silicone oil under the conditions of 150° C. to 200° C., 8 to 10 kV/mm and 10 to 30 minutes, and therefore, a piezoelectric element provided with vibration electrodes inside and outside the piezoelectric ceramic was manufactured in a manner similar to that of the piezoelectric element 10.

According to the analytical result of the peak intensity of the surface of the piezoelectric ceramic of the piezoelectric element manufactured in the comparative example by an X-ray diffraction method, it was made clear that the peak intensity nearly agreed with the peak intensity resulting from a powder having the same composition, and therefore, the sample had random orientation. Regarding the piezoelectric element manufactured in the comparative example, the ratio I/I0 of the peak intensity of the (020) plane to that of the (119) plane was measured with the result that the ratio I/I0 was 0.26. In addition, the electromechanical coupling coefficient k of the second-order harmonics of the thickness extensional vibration was measured for the piezoelectric element manufactured in the comparative example with the result that the k was 15%.

Since the directions of polarization were relatively aligned in the direction perpendicular to the electrode surfaces in the piezoelectric element 10 manufactured in Example 1, in which the peak intensity ratio I/I0 was 1.61, it was verified that the electromechanical coupling coefficient was increased compared with that of the randomly-oriented sample in which the peak intensity ratio I/I0 was 0.26.

The aforementioned peak intensity and the like will be further described.

Figure 21:
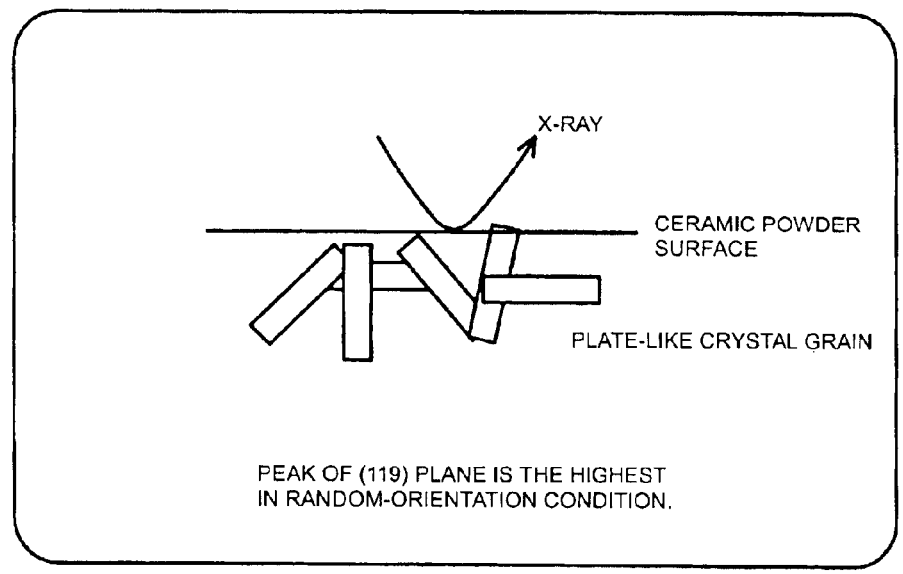
FIG. 21 is a diagram illustrating that the crystal face which shows the highest intensity is the (119) plane when the peak intensity of a ceramic powder is measured by an X-ray diffraction method.

When the peak intensity of the ceramic powder having the same composition as that of the piezoelectric ceramic 12 of the piezoelectric element 10 according to the present invention was measured by the X-ray diffraction method, as shown in FIG. 21, the crystal face which exhibits the highest peak intensity is the (119) plane.

Figure 22A:
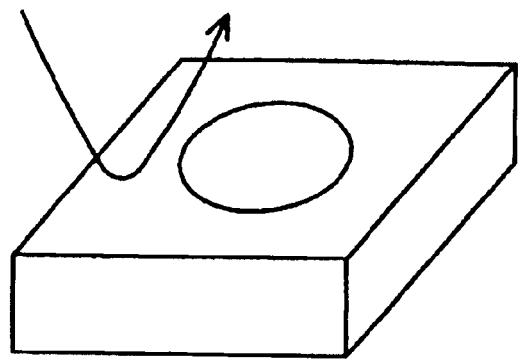
FIGS. 22A and 22B are diagrams illustrating that the (020) plane is the crystal face which shows the highest intensity when the peak intensity of a plane parallel to the vibration electrode is measured by an X-ray diffraction method regarding a piezoelectric element according to the present invention.
Figure 22B:
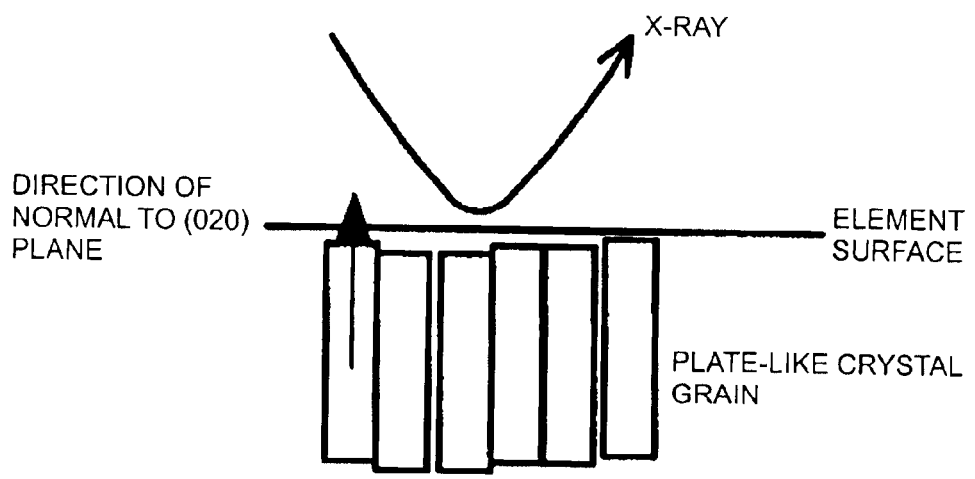

On the other hand, when the peak intensity of the plane parallel to the vibration electrodes in the piezoelectric element 10 according to the present invention was measured by the X-ray diffraction method, since the crystal axis is oriented to some degree, the (020) plane is the crystal face which exhibits the highest peak intensity, as shown in FIGS. 22A and 22B, and therefore, the reflection intensity from the (119) plane, which is the maximum when the orientation is random, is weakened.

Figure 23:
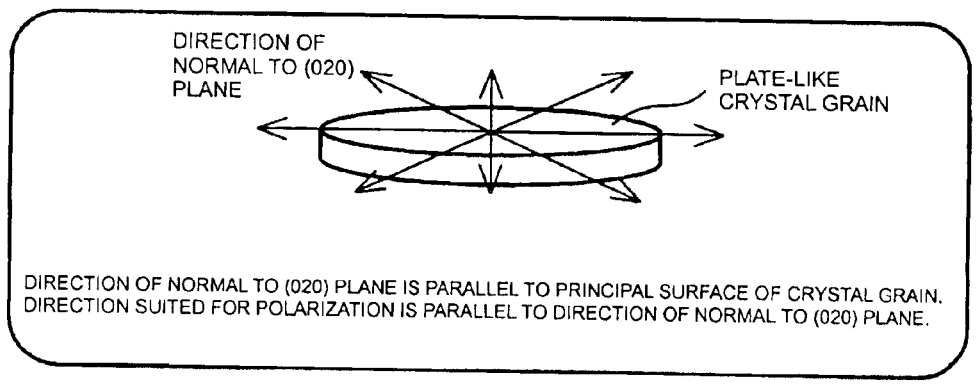
FIG. 23 is a diagram illustrating that a direction suited for polarization is nearly parallel to the direction of the normal to the (020) plane of the plate-like crystal grain.

Consequently, the degree of orientation is defined based on the ratio of the peak intensity of the (020) plane to that of the (119) plane. That is, the peak intensity of the (020) plane is increased and the peak intensity of the (119) plane is reduced as the degree of orientation is increased, and therefore, as the plate-like crystal grain becomes perpendicular to the surfaces of the vibration electrodes. Since the direction of spontaneous polarization is nearly parallel to the normal to the (020) plane of the plate-like crystal grain shown in FIG. 23, the electromechanical coupling coefficient of the piezoelectric element 10 manufactured in Example 1 is increased compared with that of the randomly-oriented sample.

Figure 24:
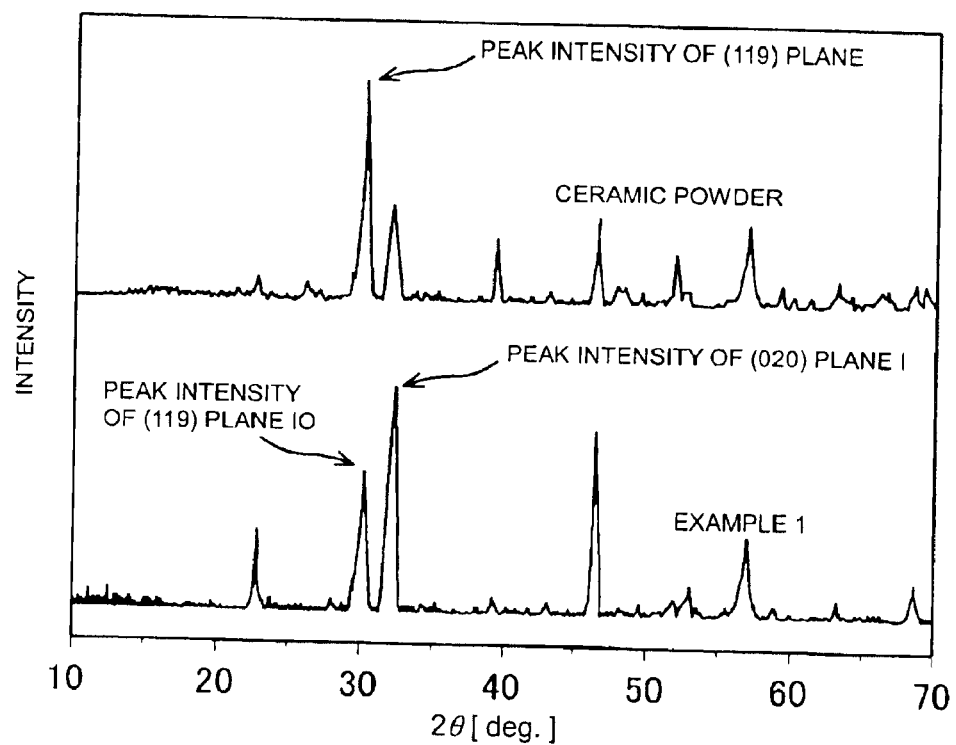
FIG. 24 is a graph showing the intensities of the electrode surfaces of the ceramic powder and the piezoelectric element 10 manufactured in Example 1 measured by an X-ray diffraction method.

FIG. 24 is a graph showing the intensities of the electrode surfaces of the ceramic powder and the piezoelectric element 10 manufactured in Example 1 measured by the X-ray diffraction method. These have the same composition. In FIG. 24, the intensity of the ceramic powder is shown in upper column of the graph in order to avoid overlap between the intensities of the ceramic powder and the piezoelectric element 10.

A conventional randomly-oriented piezoelectric element, a conventional oriented piezoelectric element and the piezoelectric element according to Example 1 will be further described.

Figure 25:
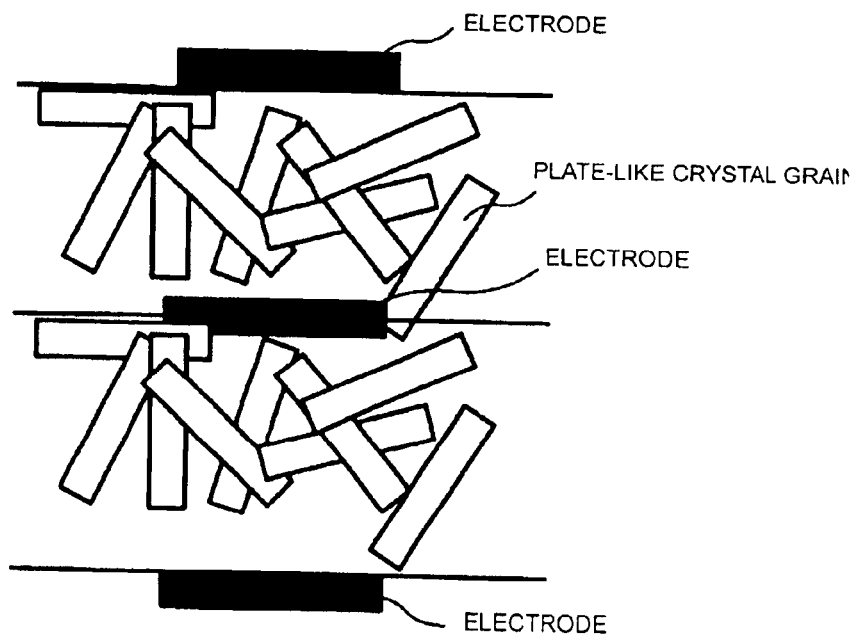
FIG. 25 is a diagram illustrating a conventional randomly-oriented piezoelectric element.
Figure 26:
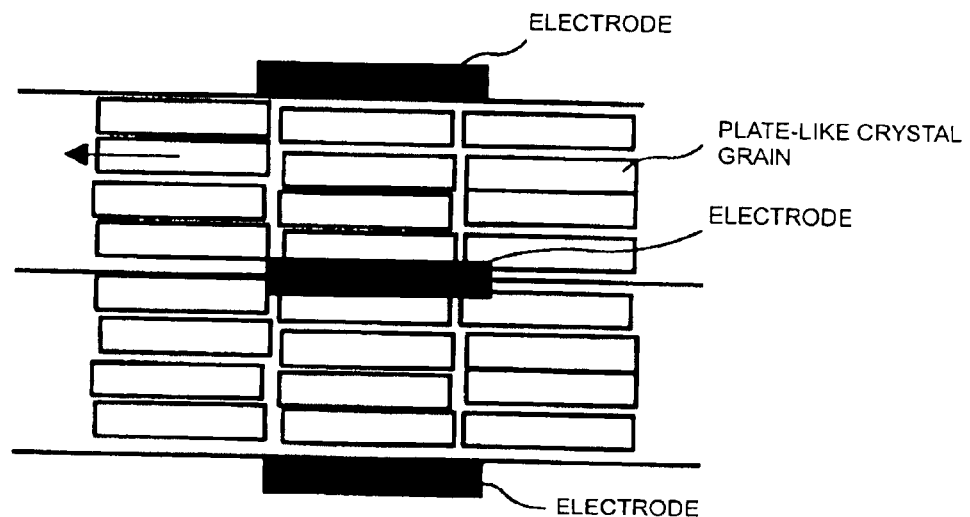
FIG. 26 is a diagram illustrating a conventional oriented piezoelectric element.
Figure 27:
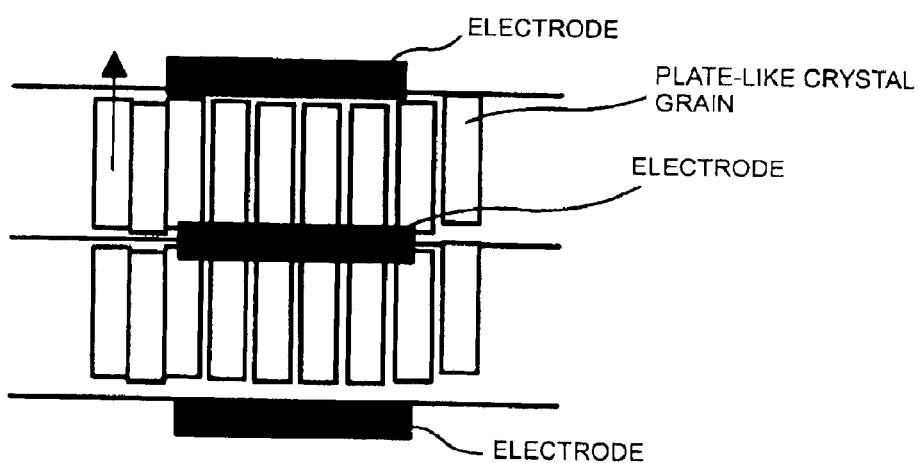
FIG. 27 is a diagram illustrating a piezoelectric element according to Example 1.

FIG. 25 is a diagram illustrating a conventional randomly-oriented piezoelectric element. FIG. 26 is a diagram illustrating a conventional oriented piezoelectric element. FIG. 27 is a diagram illustrating the piezoelectric element according to Example 1.

The conventional randomly-oriented piezoelectric element shown in FIG. 25 has a small electromechanical coupling coefficient and a low piezoelectric property.

The conventional oriented piezoelectric element shown in FIG. 26 can be manufactured with ease by the TGG method. However, since the direction of spontaneous polarization (the direction indicated by an arrow shown in FIG. 26) is the direction parallel to the principal surface of the plate-like crystal grain and, therefore, is parallel to the electrodes, there is a problem in that the piezoelectric property is low.

On the other hand, in the piezoelectric element according to Example 1 shown in FIG. 27, the direction of spontaneous polarization (the direction indicated by an arrow shown in FIG. 27) is perpendicular to the electrodes, and therefore, the piezoelectric property is improved. It was difficult to manufacture such a piezoelectric element provided with an internal electrode as the piezoelectric element according to Example 1 simply by the conventional technology.

EXAMPLE 2

In Example 2, a rectangular sheet 30 which was the same as the rectangular sheet 30 produced as the molding in Example 1 was produced through the same steps as those in Example 1.

Figure 28:
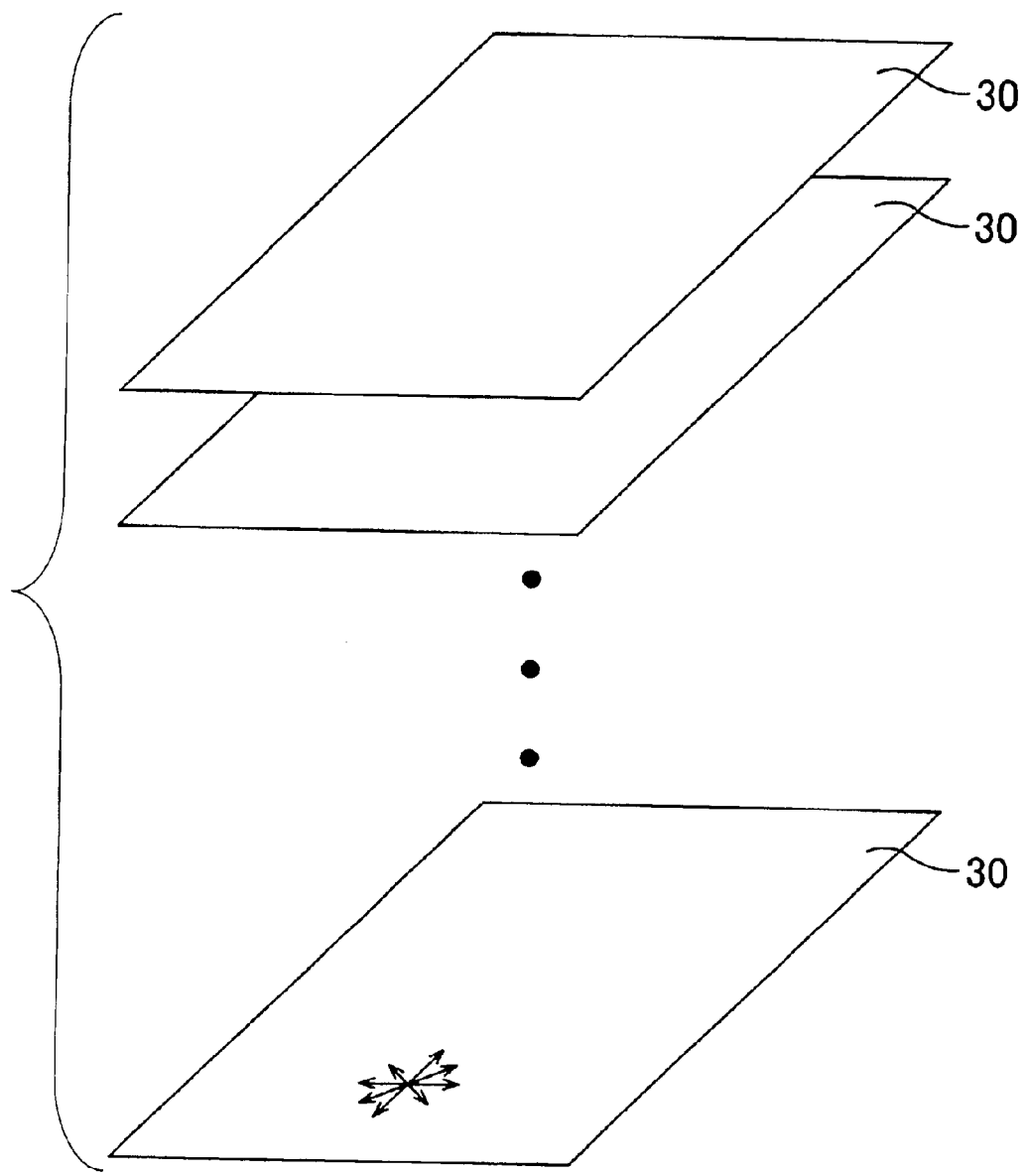
FIG. 28 is a diagram illustrating a step in Example 2.
Figure 29:
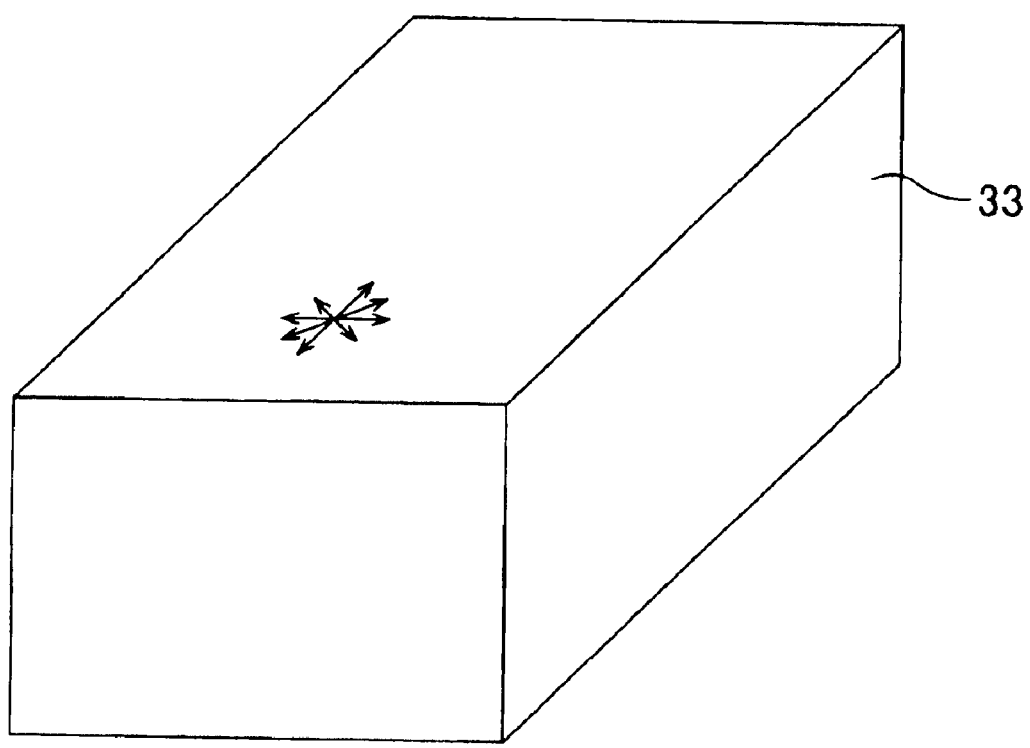
FIG. 29 is a perspective view showing another step in Example 2.

As shown in FIG. 28, a plurality of sheets 30 were laminated, and were pressure-bonded in order to have a thickness in the order of 4 mm, and therefore, as shown in FIG. 29, a block-like molding 33 was produced.

Figure 30:
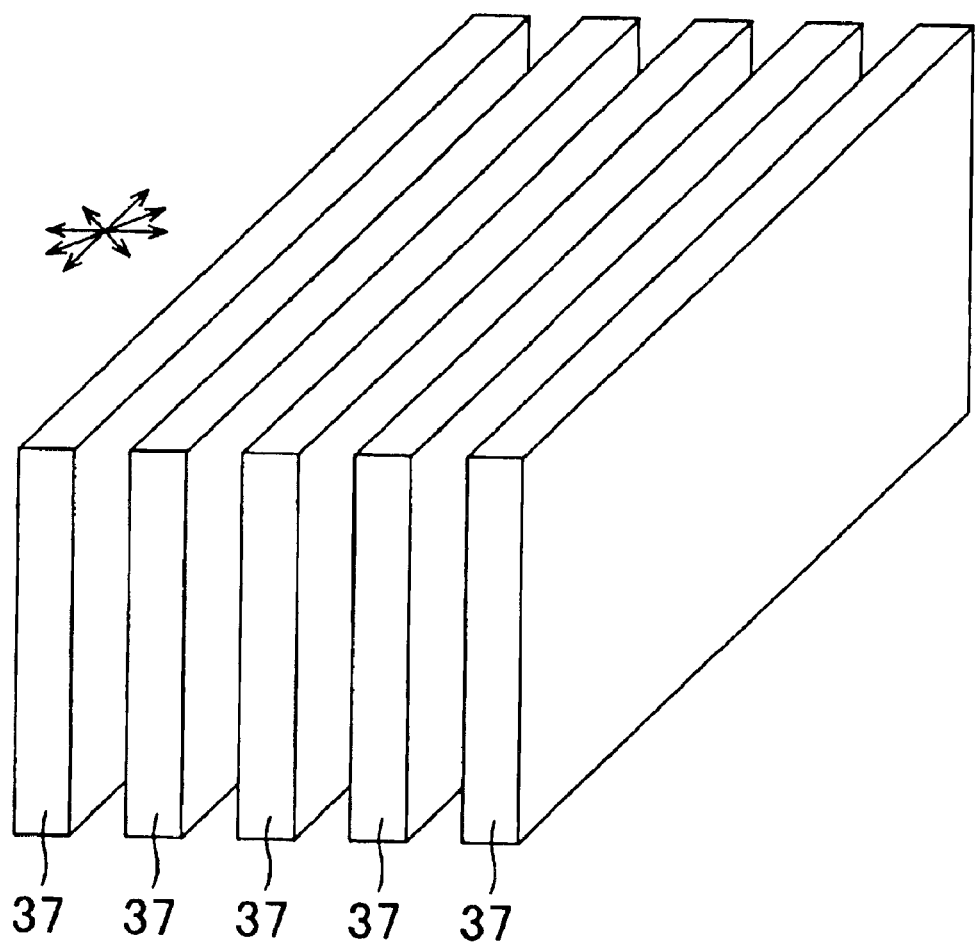
FIG. 30 is a perspective view showing another step in Example 2.

As shown in FIG. 30, the block-like molding 33 was cut in the direction parallel to the lamination direction of the sheets 30, and therefore, plate-like moldings 37 of 0.5 mm in thickness were produced.

Figure 31:
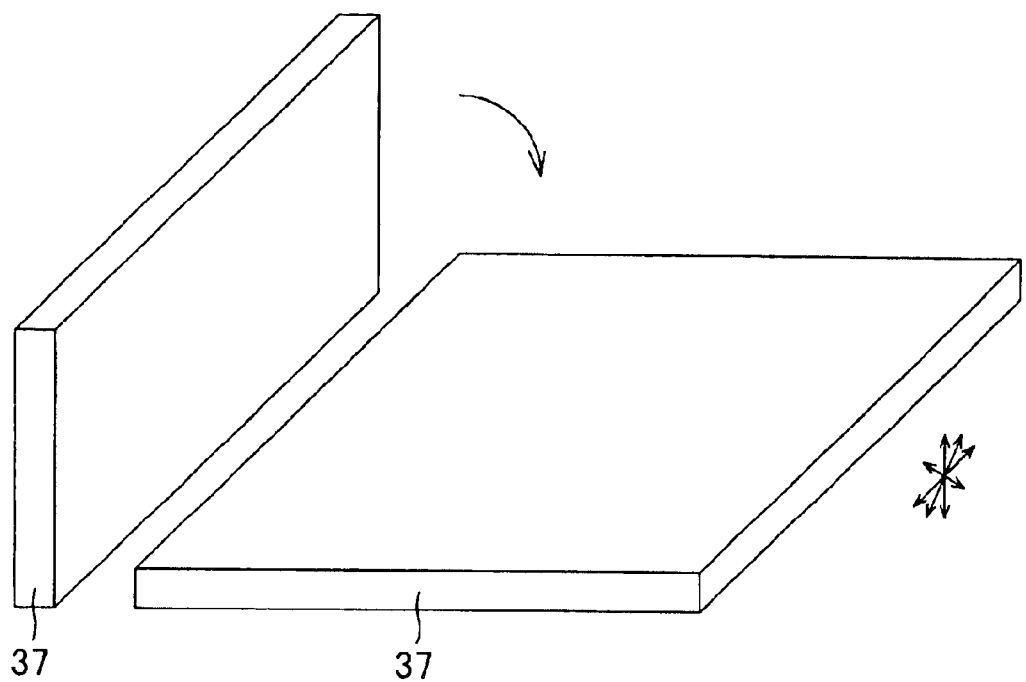
FIG. 31 is a perspective view showing another step in Example 2.
Figure 32:
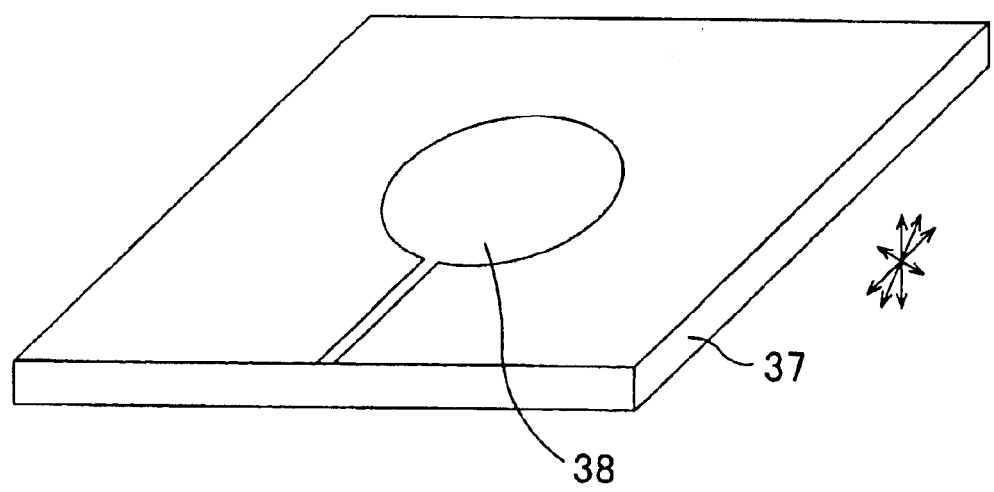
FIG. 32 is a perspective view showing another step in Example 2.

As shown in FIG. 31, the plate-like molding 37 was inclined 90°, and as shown in FIG. 32, an electrode 38 made of Pt was formed on the cut surface of the plate-like molding 37 by printing followed by drying.

Figure 33:
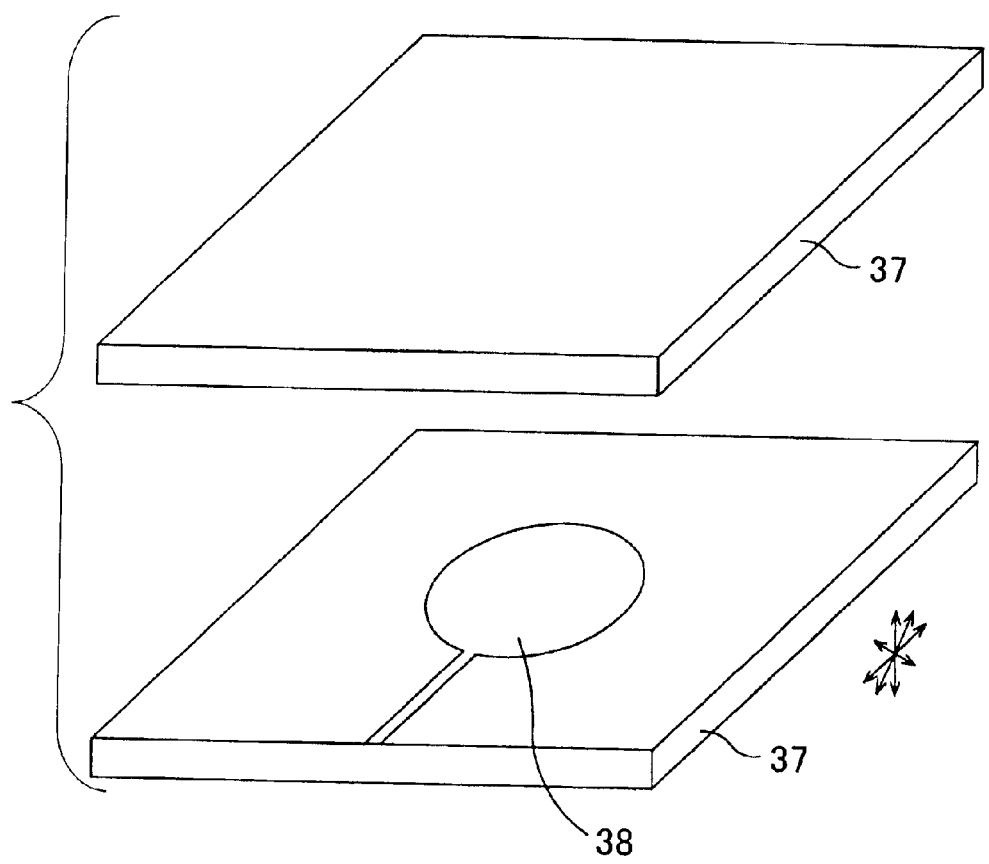
FIG. 33 is a perspective view showing another step in Example 2.
Figure 34:
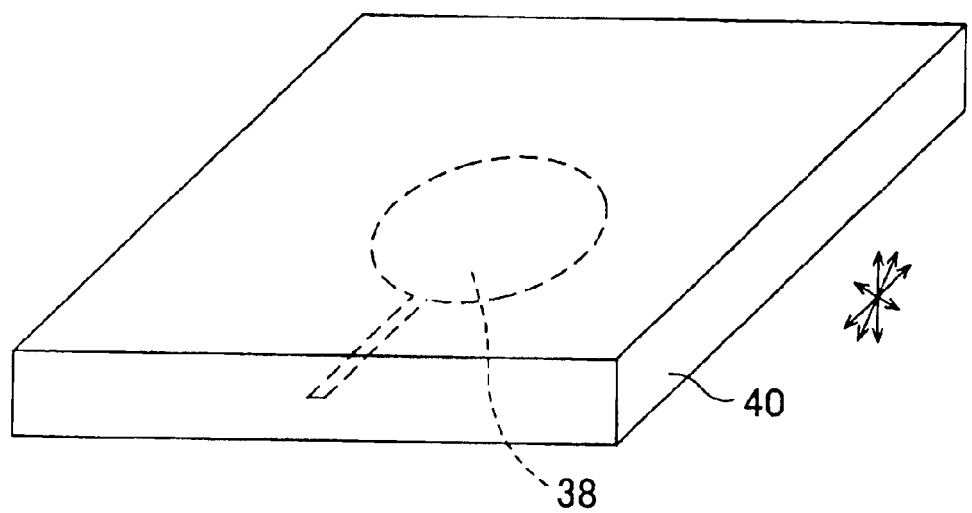
FIG. 34 is a perspective view showing another step in Example 2.

As shown in FIG. 33, the molding 37 provided with the electrode 38 and the molding 37 not provided with the electrode 38 were laminated, and were pressure-bonded so as to produce a laminate 40 provided with the electrode 38 in the inside as shown in FIG. 34.

This laminate 40 was fired at 1,150° C. for 2 hours so as to form a fired body. The fired body was subjected to a polarization treatment in silicone oil under the conditions of 150° C. to 200° C., 8 to 10 kV/mm and 10 to 30 minutes. The top surface and the bottom surface of the fired body were smoothed by lapping, and thereafter, an electrode made of Ag is formed on each of the top surface and the bottom surface of the fired body by sputtering, so that a piezoelectric element 10 provided with vibration electrodes inside and outside the piezoelectric ceramic was manufactured.

A surface of the piezoelectric ceramic 12 of the piezoelectric element 10 manufactured in Example 2 was subjected to light polishing, and the highest peak intensity I resulting from the crystal face in the direction perpendicular to the direction of polarization was measured in a manner similar to that in Example 1. As a result, the reflection from the (020) plane was the highest, and the peak intensity I thereof was 2,605 cps.

As in Example 1, it was verified that the highest peak intensity of the ceramic powder having the same composition as that of the piezoelectric ceramic 12 of the piezoelectric element 10 manufactured in Example 2 was assigned to the reflection from the (119) plane. When the plane parallel to the electrode surfaces in the piezoelectric ceramic 12 of the piezoelectric element 10 manufactured in Example 2 was measured, the peak intensity resulting from the (119) plane was 1,125 cps.

Consequently, the ratio of the peak intensity I to the peak intensity I0 regarding the piezoelectric element 10 manufactured in Example 2 was 2.31.

Figure 35:
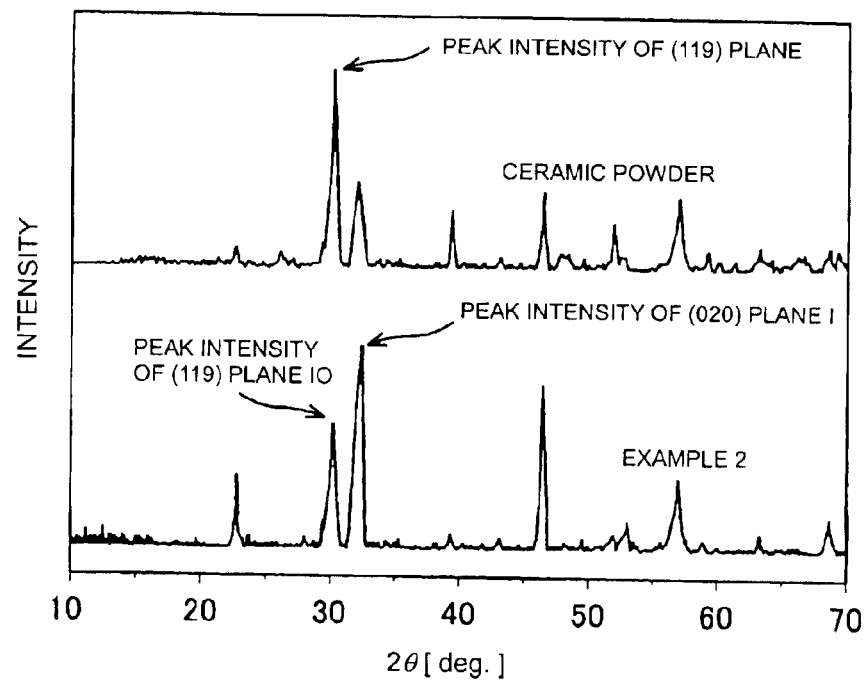
FIG. 35 is a graph showing the intensities of the electrode surfaces of the ceramic powder and the piezoelectric element 10 manufactured in Example 2 measured by an X-ray diffraction method.

FIG. 35 is a graph showing the intensities of the electrode surfaces of the ceramic powder and the piezoelectric element 10 manufactured in Example 2 measured by the X-ray diffraction method. These have the same composition. In FIG. 35, the intensity of the ceramic powder is shown in upper portion of the graph in order to avoid overlap between the intensities of the ceramic powder and the piezoelectric element 10.

The electromechanical coupling coefficient k of the second-order harmonics of the thickness extensional vibration of the piezoelectric element 10 manufactured in Example 2 was measured with an impedance analyzer HP4194A, and the resulting k was 22%.

This verified that the electromechanical coupling coefficient of the piezoelectric element 10 manufactured in Example 2 was increased compared with that of the randomly-oriented sample described in Example 1.

EXAMPLE 3

In Example 3, a rectangular sheet 30 which was the same as the rectangular sheet 30 produced as the molding in Example 1 was produced through the same steps as those in Example 1.

Figure 36:
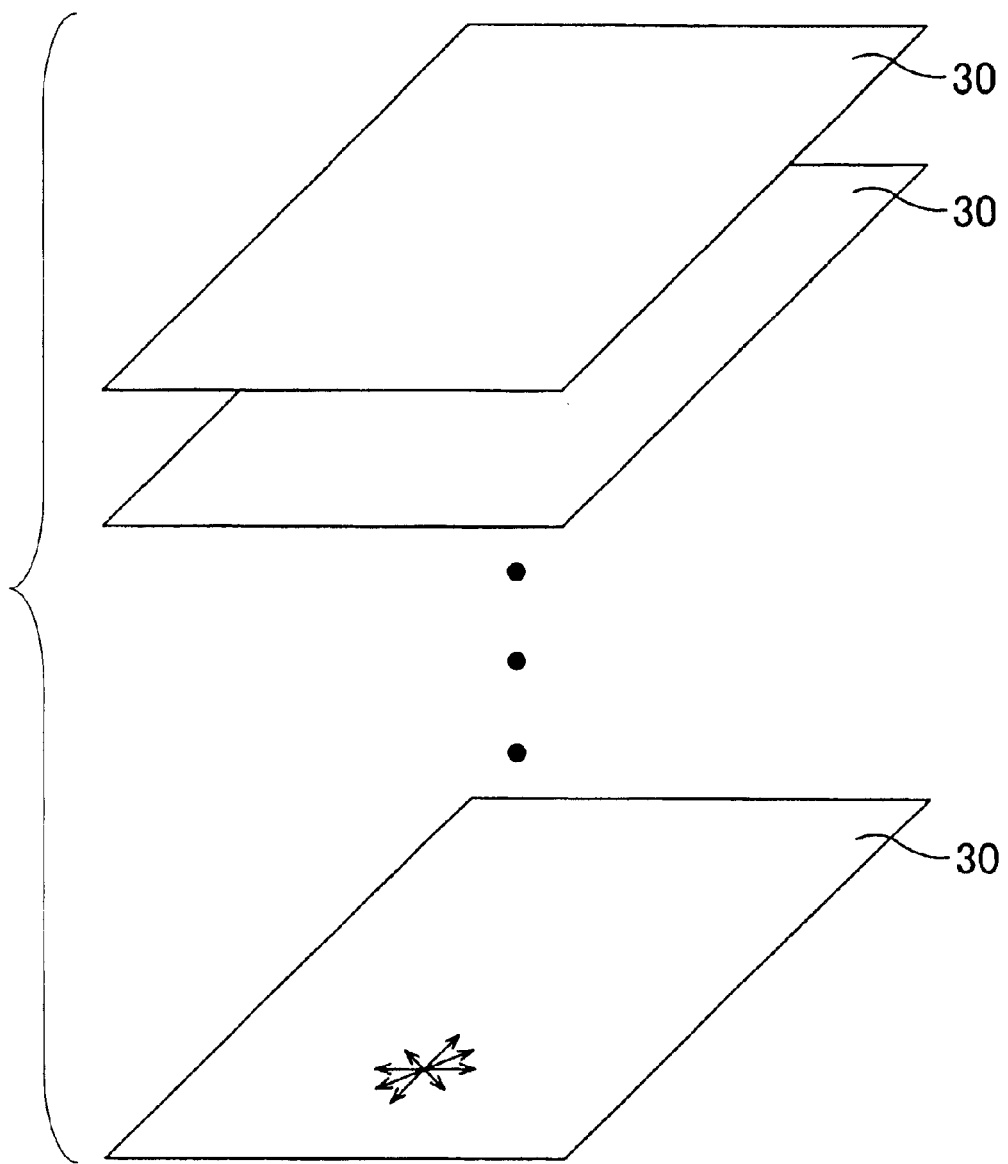
FIG. 36 is a diagram illustrating a step in Example 3.
Figure 37:
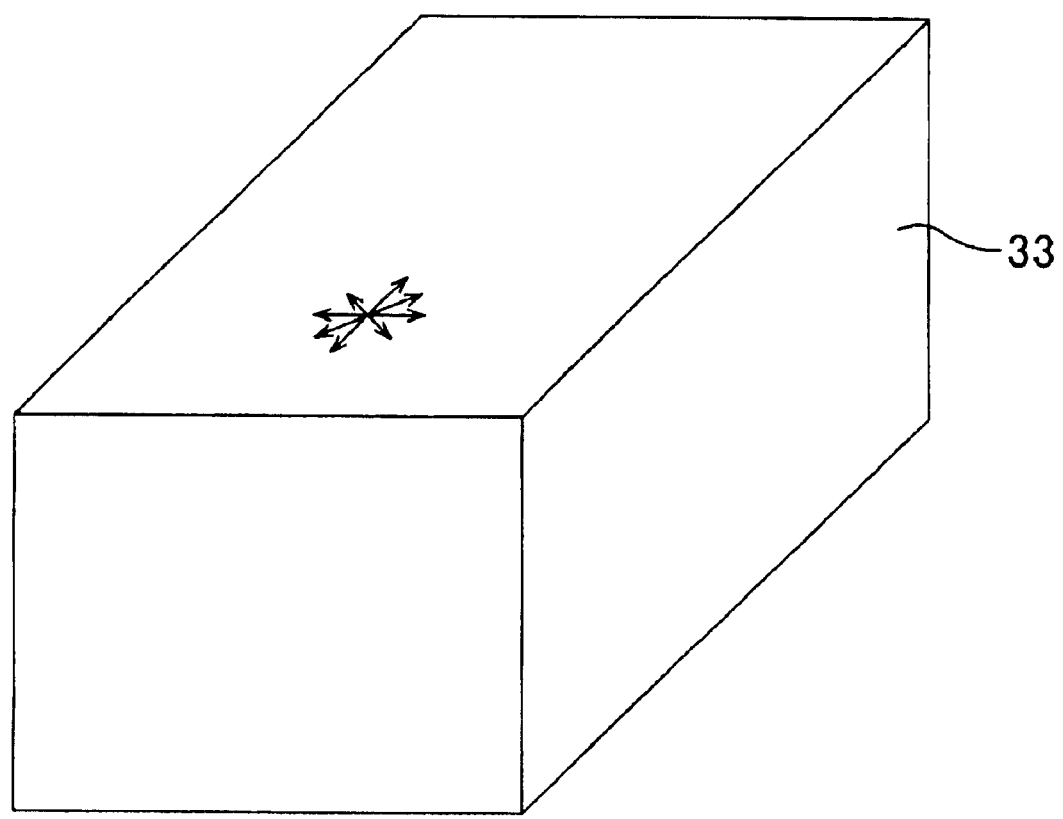
FIG. 37 is a perspective view showing another step in Example 3.

As shown in FIG. 36, a plurality of sheets 30 were laminated, and were pressure-bonded in order to have a thickness in the order of 4 mm, and therefore, as shown in FIG. 37, a block-like molding 33 was produced.

The block-like molding 33 was fired in the same way as that in Example 1 and Example 2, and therefore, a fired body was formed.

Figure 38:
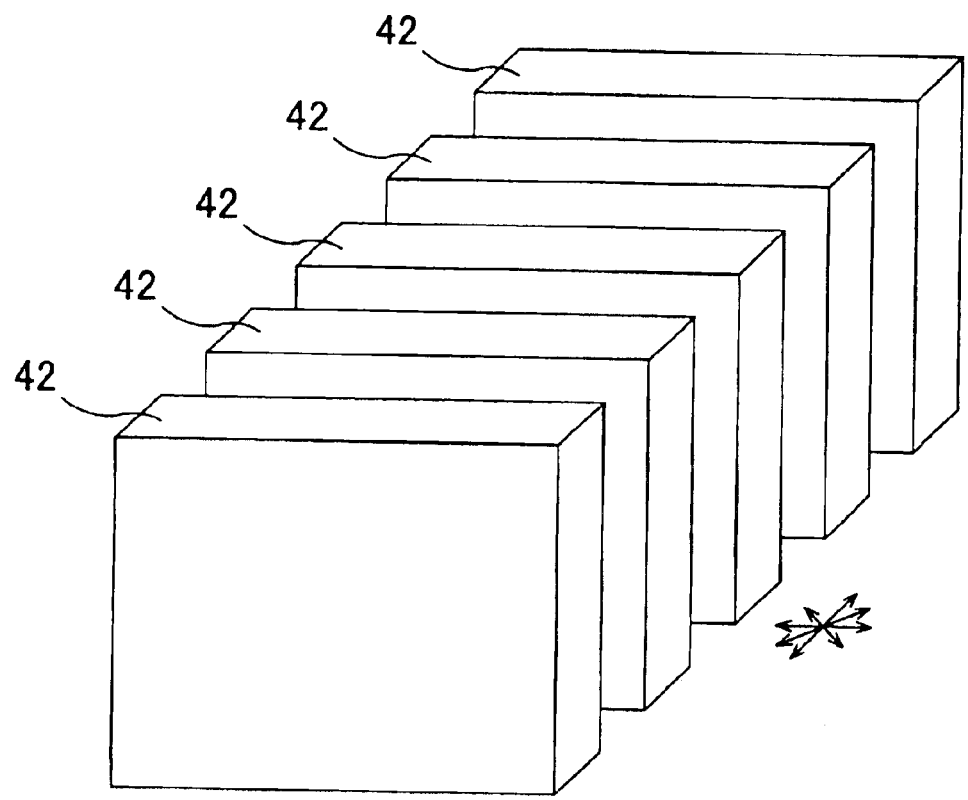
FIG. 38 is a perspective view showing another step in Example 3.

As shown in FIG. 38, the fired body 33 was cut in the direction parallel to the lamination direction of the sheets 30, and therefore, plate-like fired bodies 42 of 0.5 mm in thickness were produced.

Figure 39:
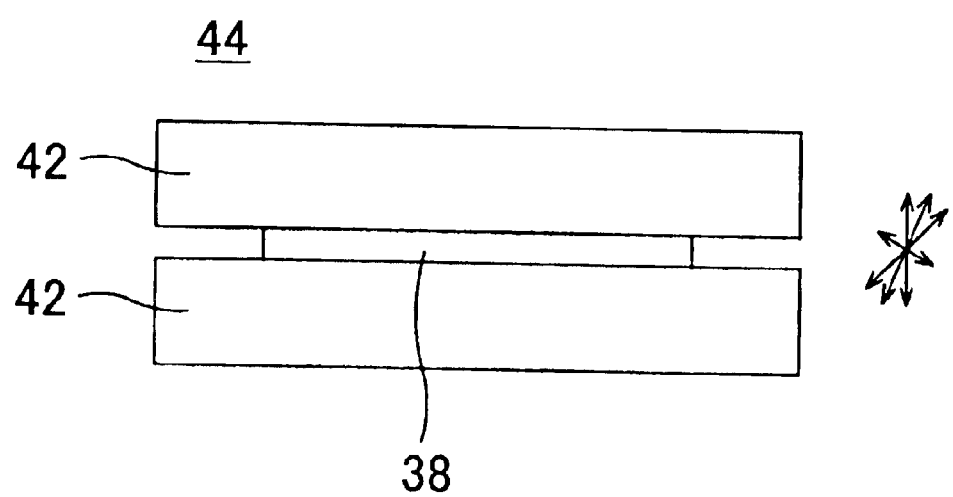
FIG. 39 is a perspective view showing another step in Example 3.

After the cut surface of the plate-like fired body 42 was polished, the polished surface of the fired body 42 was coated with an electrode paste, for example, silver paste, and the plate-like fired bodies 42 were adhered with the electrode paste. Thereafter, the electrode paste was baked, and as shown in FIG. 39, a laminate 44 in which an electrode 38 was arranged between two plate-like fired bodies 42 was formed.

An electrode is formed on each of the top surface and the bottom surface of the laminate 44, so that a piezoelectric element 10 provided with vibration electrodes inside and outside the piezoelectric ceramic was manufactured.

In a manner similar to that of the piezoelectric element 10 manufactured in Example 1 or Example 2, the piezoelectric element 10 manufactured in Example 3 had a ratio I/I0 of the peak intensity I to the peak intensity I0 of 1 or more, and in addition, it was verified that the electromechanical coupling coefficient was increased compared with that of the randomly-oriented sample.

In the aforementioned Examples, a plate-like ceramic powder was used in the mixed powder. However, in the present invention, other ceramic crystal grains having anisotropy may be used instead of the plate-like ceramic powder.

In the aforementioned Examples, a calcined powder of the ceramic material was used in the mixed powder. However, in the present invention, a powder of the ceramic raw material may be used instead of the calcined powder of the ceramic material. Furthermore, a green mixed powder may be used as the mixed powder.

In the aforementioned Examples, the molding was formed by the doctor blade method or the like. However, in the present invention, the molding may be formed by other molding methods, for example, extruding, anisotropic pressuring and rolling.

In the aforementioned Example 1, as shown in FIG. 14 and FIG. 15, the strip-like moldings 34 were laid with no clearance therebetween in a mold, followed by pressure bonding. However, those moldings 34 may be adhered with double-faced tapes instead of the use of the mold.

In the aforementioned Example 1, the moldings 36 were laminated, and were pressure-bonded, as shown in FIG. 19 and FIG. 20. In the aforementioned Example 2, the moldings 37 were laminated, and were pressure-bonded, as shown in FIG. 33. However, those moldings may be adhered with double-faced tapes as well.

The present invention can be applied to other piezoelectric elements including four layers of electrodes or more, in addition to the aforementioned piezoelectric element 10 including three layers of electrodes.

In the present invention, the term "nearly perpendicular" includes both "substantially perpendicular" and "perpendicular" in its literal sense. Furthermore, in the present invention, the term "nearly parallel" includes both "substantially parallel" and "parallel" in its literal sense.

Since the polarization axis can be preferentially oriented, and the piezoelectric element can be manufactured in which the polarization axis and the electrodes are arranged nearly perpendicularly to each other, a laminated type piezoelectric element capable of applying the excitation electric field parallel to the polarization axis can be manufactured according to the present invention. In this manner, the electromechanical coupling coefficient can be increased compared with that of the conventional randomly-oriented piezoelectric element or the conventional oriented piezoelectric element.

What is claimed is:

1. A piezoelectric element comprising:
    a ceramic piezoelectric comprising ceramic crystal grains having shape anisotropy and spontaneous polarization preferentially oriented in one plane; and
    at least three vibration electrodes arranged facing one another in overlapping relationship and with the ceramic piezoelectric therebetween,
    wherein an in-plane direction of said one plane is arranged nearly perpendicular to the vibration electrodes, and
    wherein thickness extensional mode harmonics of the order n, where n denotes a natural number of 2 or more, are excitable in the region at which at least three vibration electrodes overlap one another.

2. The piezoelectric element according to claim 1, wherein the ceramic crystal grain having shape anisotropy comprises a layer perovskite structure.

3. The piezoelectric element according to claim 2, wherein the ceramic crystal grain having shape anisotropy is in the shape of a plate.

4. The piezoelectric element according to claim 3, wherein the aspect ratio L/H is about 3 or more, where L is the major axis dimension and H is the minor axis dimension H.

5. The piezoelectric element according to claim 4, wherein the ratio I/I0 is about 1.0 or more, where a surface of the ceramic piezoelectric parallel to the vibration electrode is measured by X-ray diffraction and I represents the highest peak intensity resulting from a crystal face in the direction perpendicular to the direction of spontaneous polarization of the ceramic crystal grain, and I0 represents the peak intensity resulting from the crystal face having the highest peak intensity in a ceramic powder having the same composition as that of the ceramic crystal grain.

6. The piezoelectric element according to claim 5, wherein the piezoelectric is a bismuth layer perovskite structure compounds.

7. The piezoelectric element according to claim 1, wherein the ceramic crystal grain having shape anisotropy is in the shape of a plate.

8. The piezoelectric element according to claim 7, wherein the aspect ratio L/H is about 3 or more, where L is the major axis dimension and H is the minor axis dimension H.

9. The piezoelectric element according to claim 1, wherein the ratio I/I0 is about 1.0 or more, where a surface of the ceramic piezoelectric parallel to the vibration electrode is measured by X-ray diffraction and I represents the highest peak intensity resulting from a crystal face in the direction perpendicular to the direction of spontaneous polarization of the ceramic crystal grain, and I0 represents the peak intensity resulting from the crystal face having the highest peak intensity in a ceramic powder having the same composition as that of the ceramic crystal grain.

10. A method for manufacturing a piezoelectric element to manufacture the piezoelectric element according to claim 1, comprising:

providing at least two moldings of ceramic piezoelectric comprising ceramic crystal grains have shape anisotropy, each of which have an axis suited for polarization in the direction orthogonal to one surface thereof and one of which has a first electrode on said one surface;

forming a laminate with the moldings such that the first electrode is disposed between two moldings and in which the axis suited for polarization of the moldings are in nearly the same plane or in nearly parallel planes; and before or after forming the laminate, firing the moldings.

11. A method for manufacturing a piezoelectric element according to claim 10, wherein a second electrode is provided on a molding, the second electrode being disposed on a surface orthogonal to an axis suited for polarization thereof; a third electrode is provided on a molding not having the first electrode, the third electrode being disposed on said one surface thereof; the first, second and third electrodes being disposed such that the laminate when formed has the three electrodes arranged facing one another in overlapping relationship in nearly parallel planes with ceramic piezoelectric therebetween; and polarizing each fired molding in a direction perpendicular to an electrode surface thereof by applying a direct-current electric field to the fired molding in the direction perpendicular to an electrode surface.

12. A method of manufacturing a piezoelectric element according to claim 10, wherein the ceramic crystal grain having shape anisotropy comprises a layer perovskite structure.

13. A method of manufacturing a piezoelectric element according to claim 12, wherein the ceramic crystal grain having shape anisotropy is in the shape of a plate.

14. A method for manufacturing a piezoelectric element according to claim 10, comprising:

providing a ceramic slurry comprising ceramic crystal grains having the shape anisotropy and a powder of the ceramic raw material or calcined ceramic raw material;

forming a molding having an axis suited for polarization in the direction orthogonal to a thickness direction thereof by molding the ceramic slurry;

cutting the molding in a direction nearly parallel to the thickness direction to form at least two portions each of which has non-cut surfaces and at least one cut surface;

positioning the cut molding portions such that non-cut surfaces are in surface-contact with each other and the cut surfaces are nearly parallel to each other;

forming an electrode on a cut surface of a molding portion;

forming a laminate by laminating a plurality of molding portions, at least one of which carries the electrode, the cut surfaces being nearly parallel;

firing the laminate; and polarizing the fired material in the direction perpendicular to the electrode surface by applying a direct-current electric field to the fired material in the direction perpendicular to the electrode surface.

15. A method for manufacturing a piezoelectric element according to claim 14, wherein:

the molding is formed into a plate shape by molding the ceramic slurry;

the plate shape molding is cut into strip shaped portions; and the positioning of the strip shaped cut molding portions is such that resulting construct is in the shape of a plate.

16. A method for manufacturing a piezoelectric element according to claim 10, comprising:

providing a ceramic slurry comprising ceramic crystal grains having shape anisotropy and a powder of the ceramic raw material or calcined ceramic raw material;

forming a block-like molding having an axis suited for polarization in the direction orthogonal to one direction by molding the ceramic slurry;

cutting the molding in a direction nearly parallel to said one direction to form a plurality of portions having non-cut surfaces and at least one cut surface;

forming an electrode on a cut surface of a portion;

forming a laminate by laminating cut molding portions including the electrode carrying portion such that the axes suited for polarization are nearly parallel to each other;

firing the laminate; and polarizing the fired material in the direction perpendicular to the electrode surface by applying a direct-current electric field to the fired material in the direction perpendicular to the electrode surface.

17. A method for manufacturing a piezoelectric element according to claim 16, wherein:

the block shaped molding is cut into portions having the shape of a plate; and the laminate is formed in the shape of a plate.

18. A method for manufacturing a piezoelectric element according to claim 10, comprising:

providing a ceramic slurry comprising ceramic crystal grains having shape anisotropy and a powder of the ceramic raw material or calcined ceramic raw material;

forming a molding having an axis suited for polarization in the direction orthogonal to one direction by molding the ceramic slurry;

firing the molding;

cutting the fired molding in a direction nearly parallel to said one direction to form portions having non-cut surfaces and at least one cut surface;

forming an electrode on a cut surface of a portion;

forming a laminate by laminating fired portions including the electrode carrying portion such that the axes suited for polarization are nearly parallel to each other; and polarizing the laminate in the direction perpendicular to the electrode surface by applying a direct-current electric field to the laminate in the direction perpendicular to the electrode surface.

19. A method for manufacturing a piezoelectric element according to claim 18, wherein:

the ceramic slurry is molding in the shape of a block; and the block shaped molding is cut into portions having the shape of a plate.

* * * * *